(12) United States Patent
Carcasi et al.

(10) Patent No.: US 11,474,028 B2
(45) Date of Patent: Oct. 18, 2022

(54) SYSTEMS AND METHODS FOR MONITORING ONE OR MORE CHARACTERISTICS OF A SUBSTRATE

(71) Applicant: Tokyo Electron Limited, Tokyo (JP)

(72) Inventors: Michael Carcasi, Austin, TX (US); Mark Somervell, Hillsboro, OR (US); Joshua Hooge, Austin, TX (US); Masahide Tadokoro, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 123 days.

(21) Appl. No.: 17/037,050

(22) Filed: Sep. 29, 2020

(65) Prior Publication Data

US 2021/0109015 A1   Apr. 15, 2021

Related U.S. Application Data

(60) Provisional application No. 62/915,210, filed on Oct. 15, 2019.

(51) Int. Cl.
| | |
|---|---|
| *G01B 11/28* | (2006.01) |
| *G01N 21/31* | (2006.01) |
| *G01B 11/06* | (2006.01) |
| *G01N 21/95* | (2006.01) |
| *H01L 21/687* | (2006.01) |
| *G03F 7/16* | (2006.01) |
| *H01L 21/67* | (2006.01) |

(52) U.S. Cl.
CPC ......... *G01N 21/31* (2013.01); *G01B 11/0625* (2013.01); *G01N 21/9501* (2013.01);
(Continued)

(58) Field of Classification Search
CPC .............. G01N 21/31; G01N 21/9501; G01N 2201/06113; G01B 11/0625;
(Continued)

(56) References Cited

U.S. PATENT DOCUMENTS

| | | |
|---|---|---|
| 6,493,078 B1 | 12/2002 | Fitzsimmons |
| 6,680,078 B2 | 1/2004 | Davlin |
| (Continued) | | |

FOREIGN PATENT DOCUMENTS

WO      0229390 W    4/2002

OTHER PUBLICATIONS

AS7265x Datasheet, Jul. 9, 2018.
(Continued)

*Primary Examiner* — Md M Rahman
(74) *Attorney, Agent, or Firm* — Slater Matsil, LLP

(57) ABSTRACT

A substrate inspection system is provided to monitor characteristics of a substrate, while the substrate is disposed within (or being transferred into/out of) a processing unit of a liquid dispense substrate processing system. The inspection system is integrated within a liquid dispense substrate processing system and includes one or more optical sensors of a reflectometer (such as a spectrometer or laser-based transceiver) configured to obtain spectral data from a substrate. A controller is coupled to receive the spectral data from the optical sensors(s). The one or more optical sensors (or one or more optical fibers coupled to the rest of the optical sensor hardware) are coupled at locations within the substrate processing system. The controller analyzes the spectral data received from the optical sensors(s) to detect characteristic(s) of the substrate including, but not limited to, film thickness (FT), refractive index changes, and associated critical dimension (CD) changes.

25 Claims, 14 Drawing Sheets

(52) U.S. Cl.
CPC .............. *G03F 7/162* (2013.01); *G03F 7/168* (2013.01); *H01L 21/67253* (2013.01); *H01L 21/68764* (2013.01); *G01N 2201/06113* (2013.01)

(58) Field of Classification Search
CPC . G01B 11/0683; G01B 2210/48; G03F 7/162; G03F 7/168; G03F 7/3021; H01L 21/67253; H01L 21/68764; H01L 21/6715
USPC .......................................................... 356/630
See application file for complete search history.

(56) References Cited

U.S. PATENT DOCUMENTS

| | | | |
|---|---|---|---|
| 6,693,708 B1 | 2/2004 | Hunter | |
| 6,707,545 B1 | 3/2004 | Hunter | |
| 6,721,045 B1 | 4/2004 | Hunter | |
| 6,818,064 B2 | 11/2004 | Baker | |
| 6,866,559 B2 | 3/2005 | Lehman | |
| 7,012,684 B1 | 3/2006 | Hunter | |
| 7,670,643 B2 | 3/2010 | Winter | |
| 2010/0091284 A1 | 4/2010 | Mieher et al. | |
| 2013/0010296 A1 | 1/2013 | Kwak et al. | |
| 2015/0029517 A1 | 1/2015 | Park et al. | |
| 2015/0346609 A1 | 12/2015 | Den Boef | |
| 2015/0362367 A1 | 12/2015 | Seo et al. | |
| 2019/0217325 A1 | 7/2019 | Devilliers | |
| 2019/0217326 A1 | 7/2019 | Devilliers | |
| 2019/0287793 A1 | 9/2019 | Devilliers | |

OTHER PUBLICATIONS

Keyence LV Series Datasheet, 2011.
PCT International Search Report in counterpart PCT application PCT/US2020/053302, dated Jan. 15, 2021, 11 pages.

SYSTEMS AND METHODS FOR MONITORING ONE OR MORE CHARACTERISTICS OF A SUBSTRATE

This application claims priority to U.S. Provisional Patent Application No. 62/915,210, entitled, "Systems and Methods for Monitoring One or More Characteristics of a Substrate," filed Oct. 15, 2019; the disclosure of which is expressly incorporated herein, in its entirety, by reference.

BACKGROUND

The present disclosure relates to the processing of substrates. In particular, it provides a novel system and method for monitoring one or more characteristics of a substrate. In one embodiment, the system and method disclosed herein may be utilized when processing semiconductor substrates.

Traditional substrate processing systems utilize photolithography processes, which include photoresist coating, exposure, and photoresist develop steps. The materials and processes utilized in these steps may all impact film thickness, critical dimension targeting, line roughness, and uniformity on a substrate. As geometries in substrate processing continue to shrink, the technical challenges to forming structures on substrates increase.

In conventional substrate processing systems, a wafer inspection system (WIS) is often used to inspect a substrate (e.g., a semiconductor wafer) during or after one or more processing steps are performed. For example, a conventional WIS may determine a film thickness (FT) of a layer or film applied to a surface of a wafer after the wafer is subject to a Post Apply Bake (PAB) procedure to cure or harden the layer or film. In another example, a conventional WIS may determine a critical dimension (CD) of a structure formed on the wafer after the wafer is developed to form the structure. Such data may be provided to an advanced process control (APC) system. APC systems may use statistical and/or analytical techniques to process the FT or CD value(s) received from a wafer inspection system and determine how to manipulate process control parameters and/or inputs on process tools to improve output quality. For example, an APC may use an average FT value determined from a WIS to control the speed of a spin chuck disposed within a liquid processing unit (e.g., a coating unit or developing unit) of a substrate processing system. In another example, an APC may use an average CD value determined from a WIS to control the temperature in a baking unit (e.g., a Post Exposure Bake (PEB) unit) of a substrate processing system. In addition, most wafer inspection systems are currently provided as a separate module within, or coupled to, the substrate processing system. This adds complexity to the substrate processing system and forces the APC system to be a feedback system.

SUMMARY

Various embodiments of systems and methods for monitoring one or more characteristics of a substrate are disclosed herein. More specifically, the present disclosure provides various embodiments of a substrate inspection system (in one exemplary embodiment, a wafer inspection system) and a method for monitoring one or more characteristics of a substrate, while the substrate is disposed within a processing unit (e.g., a liquid dispense unit, baking unit or combined bake module) of a substrate processing system, or in the process of being transferred into/out of a processing unit. The characteristics monitored by the wafer inspection systems and methods disclosed herein may include, but are not limited to, film thickness (FT), refractive index changes, and associated critical dimension (CD) changes.

In the disclosed embodiments, a substrate inspection system integrated within a substrate processing system generally includes one or more optical sensors coupled to obtain spectral data, for a given wavelength or range of wavelengths, from a substrate, and a controller coupled to receive the spectral data from the optical sensor(s). Optical sensors suitable for use within the substrate inspection system disclosed herein include, but are not limited to, any optical sensors utilized with reflectometers. The reflectometers utilized may be any of a wide variety of reflectometers. The description herein provides specific exemplary reflectometers that are spectrometers and laser-based transceivers. However, it will be recognized that the use of spectrometers and laser-based transceivers are merely exemplary reflectometers and the techniques described herein are not limited to those types of reflectometers. The one or more optical sensors may be coupled at various locations within the substrate processing system. As used herein, the coupling of an optical sensor to a particular location within the substrate processing system may be accomplished by providing the whole optical sensor unit at such location or by providing a light input (for example an optical fiber) at the particular location within the substrate processing system. For example, an optical fiber may provide light to other optical sensor hardware that may be located elsewhere. Thus, the whole optical sensor apparatus (or an input connected to the rest of the optical sensor hardware) may be configured to obtain spectral data from the substrate, while the substrate is disposed within, or in the process of being transferred into/out of, a processing unit of the substrate processing system. The controller analyzes the spectral data received from the optical sensor(s) to detect one or more characteristics of a substrate.

According to one embodiment, a system provided herein may generally include at least one processing unit for processing a substrate and a substrate inspection system (or wafer inspection system) for monitoring one or more characteristics of the substrate while the substrate is disposed within the at least one processing unit, or in a process of being transferred into or out of the at least one processing unit. The substrate inspection system may comprise one or more optical sensors configured to obtain spectral data from the substrate, and a controller that is coupled to receive the spectral data from the one or more optical sensors and configured to analyze the spectral data to detect one or more characteristics of the substrate. In some embodiments, the one or more optical sensors may be sensors of a reflectometer. In some embodiments the reflectometer may be a spectrometer. In other embodiments, the reflectometer may be a laser-based transceiver.

According to one embodiment, a system for dispensing a liquid on a substrate is provided. The system may comprise a plurality of processing units, wherein the plurality of processing units comprise at least one liquid dispense unit and at least one bake unit, the liquid dispense unit configured to dispense the liquid on the substrate. The system further comprises a substrate inspection system configured to monitor one or more characteristics of the substrate while the substrate is disposed within the at least one liquid dispense unit or the at least one bake unit or in a process of being transferred into or out of the at least one liquid dispense unit or the at least one bake unit. The substrate inspection system comprises one or more reflectometers configured to obtain spectral data from the substrate, and a controller coupled to receive the spectral data from the one or more reflectometers and configured to analyze the spectral data to detect one or more characteristics of the substrate.

In some embodiments, the one or more optical sensors may be configured to obtain the spectral data from the substrate as the substrate is being transferred into or out of the at least one processing unit. In one embodiment, the system may include two or more processing units, and the one or more optical sensors, or more inputs to the one or more optical sensors, may be coupled to one end of a main arm mechanism that is arranged between the two or more processing units for transferring the substrate into and out of the two or more processing units. In another embodiment, the one or more optical sensors, or more inputs to the one or more optical sensors, are coupled to the at least one processing unit and positioned above a loading/unloading opening of the at least one processing unit.

In some embodiments, the one or more optical sensors may be configured to obtain the spectral data from the substrate as the substrate is being processed within the at least one processing unit or immediately after the processing is complete. In these embodiments, the one or more optical sensors may be disposed within the at least one processing unit.

In some embodiments, one or more optical sensors, or one or more inputs to the one or more optical sensors, may be coupled to at least one arm disposed within the at least one processing unit. The at least one arm may, in some embodiments, be movable in at least one direction. In one embodiment, the at least one processing unit may be a liquid dispense unit in which a spin chuck is included to support and rotate the substrate, and the one or more optical sensors, or one or more inputs to the one or more optical sensors, may be positioned on the at least one arm above the spin chuck. In another embodiment, the at least one processing unit may be a bake unit in which a bake plate is included to thermally treat the substrate, and the one or more optical sensors, or one or more inputs to the one or more optical sensors, may be positioned on the at least one arm above the bake plate.

In some embodiments, the one or more optical sensors, or one or more inputs to the one or more optical sensors, may be coupled to a ceiling of the at least one processing unit. In one embodiment, the at least one processing unit may be a liquid dispense unit in which a spin chuck is included to support and rotate the substrate, and the one or more optical sensors, or one or more inputs to the one or more optical sensors, may be coupled to the ceiling of the liquid dispense unit and positioned above the spin chuck. In another embodiment, the at least one processing unit may be a combined bake module comprising a processing chamber configured to thermally treat the substrate and a cooling chamber configured to cool the substrate, and wherein the one or more optical sensors, or one or more inputs to the one or more optical sensors, are coupled to the ceiling of the combined bake module between the processing chamber and the cooling chamber.

As noted above, the controller may be generally configured to analyze the spectral data received from the one or more optical sensors to monitor one or more characteristics of a substrate. In some embodiments, for example, the controller may use the broadband spectral data received from one or more spectrometers, or the more narrowband spectral data received from one or more laser-based transceivers, to determine a film thickness of a film or layer applied to a surface of the substrate by measuring reflectance of one or more wavelengths. In other embodiments, the controller may compare the broadband spectral data received from one or more spectrometers to a golden spectrum or an average spectrum to detect differences in spectrum that are used in wave front detection or coat fault detection. In other embodiments, the controller may combine the spectral data received from one or more spectrometers or one or more laser-based transceivers with additional thickness information obtained from one or more locations on the substrate to relate spectrum/wavelength to thickness at the one or more locations.

According to another embodiment, a method is provided herein to monitor one or more characteristics of a substrate. In general, the method may comprise transferring the substrate into a processing unit of a substrate processing system, processing the substrate within the processing unit, and transferring the substrate out of the processing unit once processing is complete. In addition, the method may comprise obtaining spectral data from the substrate while the substrate is disposed within the processing unit or in a process of being transferred into or out of the processing unit, and analyzing the spectral data to monitor one or more characteristics of the substrate. In the disclosed method, the spectral data may be obtained from the substrate by one or more optical sensors of a reflectometer. Exemplary reflectometers include, but are not limited spectrometers and laser-based transceivers.

According to another method embodiment, a method to monitor one or more characteristics of a substrate in a liquid dispense substrate processing system which is configured to dispense a liquid on the substrate is provided. The method may comprise transferring the substrate into a processing unit of the liquid dispense substrate processing system, the processing unit being a liquid dispense unit or a bake unit. The method further comprises processing the substrate within the processing unit and transferring the substrate out of the processing unit once processing is complete. The method further comprises obtaining spectral data from the substrate while the substrate is disposed within the processing unit or in a process of being transferred into or out of the processing unit, wherein the spectral data is obtained utilizing a reflectometer. The method also comprises analyzing the spectral data to monitor one or more characteristics of the substrate.

In some embodiments, the spectral data may be obtained as the substrate is transferred into or out of the processing unit. In one example, the substrate processing system includes two or more processing units and the spectral data may be obtained from the substrate by one or more optical sensors, or one or more inputs to the one or more optical sensors, which are coupled to a main arm mechanism that is arranged between the two or more processing units for transferring the substrate into and out of the two or more processing units. In another example, the spectral data may be obtained from the substrate by one or more optical sensors, or one or more inputs to the one or more optical sensors, which are coupled to the processing unit and positioned above a loading/unloading opening of the processing unit. In another example, the spectral data may be obtained from the substrate by one or more optical sensors, or one or more inputs to the one or more optical sensors, which are coupled to at least one arm disposed within the processing unit.

In other embodiments, the spectral data may be obtained while the substrate is disposed within the processing unit. In one example, the spectral data may be obtained from the substrate by one or more optical sensors, or one or more inputs to the one or more optical sensors, which are coupled to a ceiling of the processing unit. In another example, the spectral data may be obtained from the substrate by one or more optical sensors, or one or more inputs to the one or more optical sensors, which are coupled to at least one arm disposed within the processing unit.

In some embodiments, the spectral data may be obtained at one or more radial positions on the substrate while the substrate is rotated within the processing unit. In some embodiments, the spectral data may be alternatively or additionally be obtained by moving an arm comprising one or more optical sensors, or one or more inputs to the one or more optical sensors, above an upper surface of the substrate to collect the spectral data. In some embodiments, the spectral data may be obtained as the substrate is transferred from one processing chamber to another processing chamber within the processing unit.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
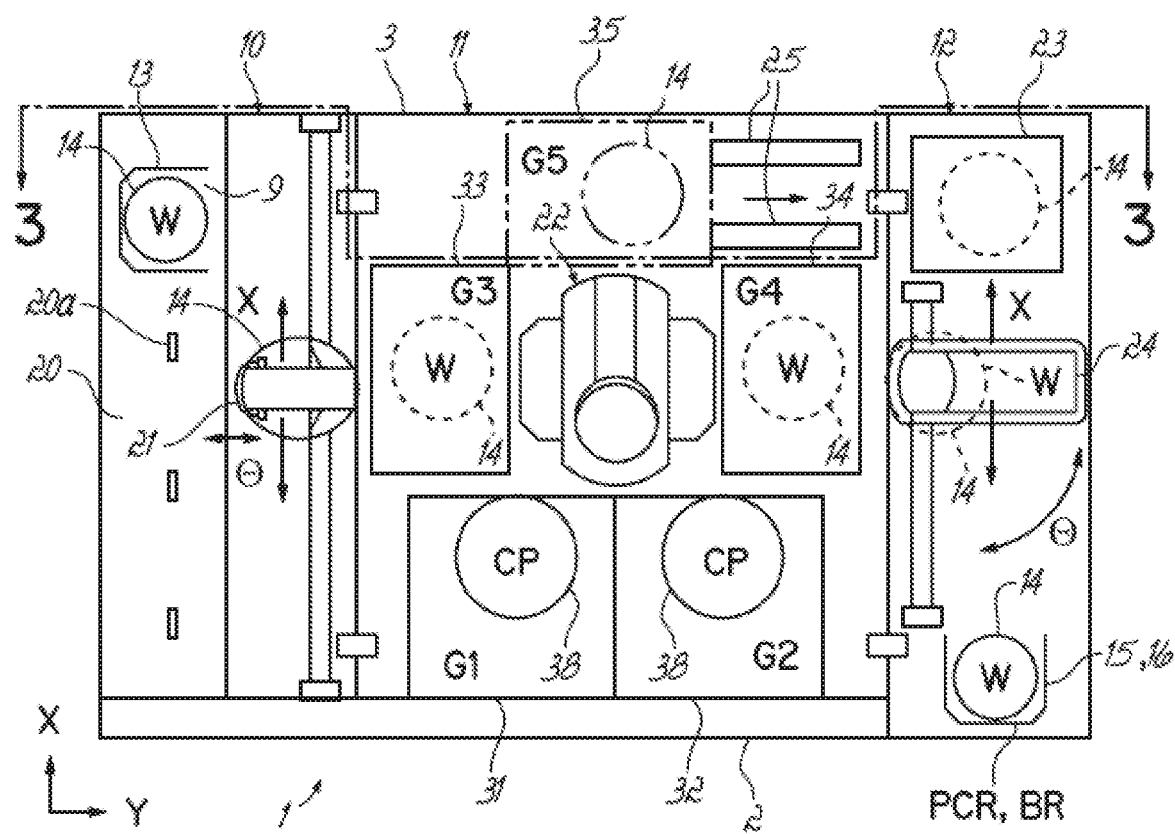
FIG. 1 (PRIOR ART) is a top view of a substrate processing system.

Various embodiments of systems and methods for monitoring one or more characteristics of a substrate are disclosed herein. More specifically, the present disclosure provides various embodiments of a substrate inspection system (in one exemplary embodiment, a wafer inspection system) and a method for monitoring one or more characteristics of a substrate, while the substrate is disposed within a processing unit (e.g., a liquid dispense unit, baking unit or combined bake module) of a substrate processing system, or in the process of being transferred into/out of a processing unit. The characteristics monitored by the wafer inspection systems and methods disclosed herein may include, but are not limited to, film thickness (FT), refractive index changes, and associated critical dimension (CD) changes In the disclosed embodiments, a wafer inspection system (WIS) integrated within a substrate processing system generally includes one or more optical sensors coupled to obtain spectral data from a substrate, and a controller coupled to receive the spectral data from the optical sensors(s). Optical sensors suitable for use within the substrate inspection system disclosed herein include, but are not limited to, any optical sensors utilized with reflectometers. The reflectometers utilized may be any of a wide variety of reflectometers. The description herein provides specific exemplary reflectometers that are spectrometers and laser-based transceivers. However, it will be recognized that the use of spectrometers and laser-based transceivers are merely exemplary reflectometers and the techniques described herein are not limited to those types of reflectometers. The one or more optical sensors may be coupled at various locations within the substrate processing system. As used herein, the coupling of an optical sensor to a particular location within the substrate processing system may be accomplished by providing the whole optical sensor unit at such location or by providing a light input (for example an optical fiber) at the particular location within the substrate processing system. For example, an optical fiber may provide light to other optical sensor hardware that may be located elsewhere. Thus, the whole optical sensor apparatus (or an input connected to the rest of the optical sensor) may be configured to obtain spectral data from the substrate, while the substrate is disposed within, or in the process of being transferred into/out of, a processing unit of the substrate processing system. The controller analyzes the spectral data received from the optical sensor(s) to detect one or more characteristics of a substrate.

In some embodiments, the optical sensor(s) (or optical sensor inputs) may be coupled to one end of a main arm mechanism, which is arranged between two or more processing units of a substrate processing system for transferring substrates into/out of the processing units. In other embodiments, the optical sensor(s) (or optical sensor inputs) may be coupled to and positioned above a loading/unloading opening of at least one processing unit (e.g., a liquid dispense unit and/or baking unit) of a substrate processing system. In such embodiments, the optical sensor(s) may obtain spectral data from a substrate as the substrate is being transferred into/out of a processing unit.

In some embodiments, the optical sensor(s) (or optical sensor inputs) may be disposed within at least one processing unit (e.g., a liquid dispense unit, baking unit or combined bake module) of a substrate processing system. In one example embodiment, the optical sensor(s) (or optical sensor inputs) may be coupled to at least one arm (e.g., a dispense arm and/or a separate arm) disposed within a liquid dispense unit, such as a coating unit or a develop unit. In another example embodiment, the optical sensor(s) (or optical sensor inputs) may be coupled to an arm disposed within a thermal processing unit, such as a baking unit. In another example embodiment, the optical sensor(s) (or optical sensor inputs) may be coupled to a ceiling of a processing unit (e.g., a liquid dispense unit, baking unit or combined bake module) of a substrate processing system. In such embodiments, the optical sensor(s) may obtain spectral data from a substrate as the substrate is being processed within the processing unit and/or immediately after said processing is complete.

Figure 2:
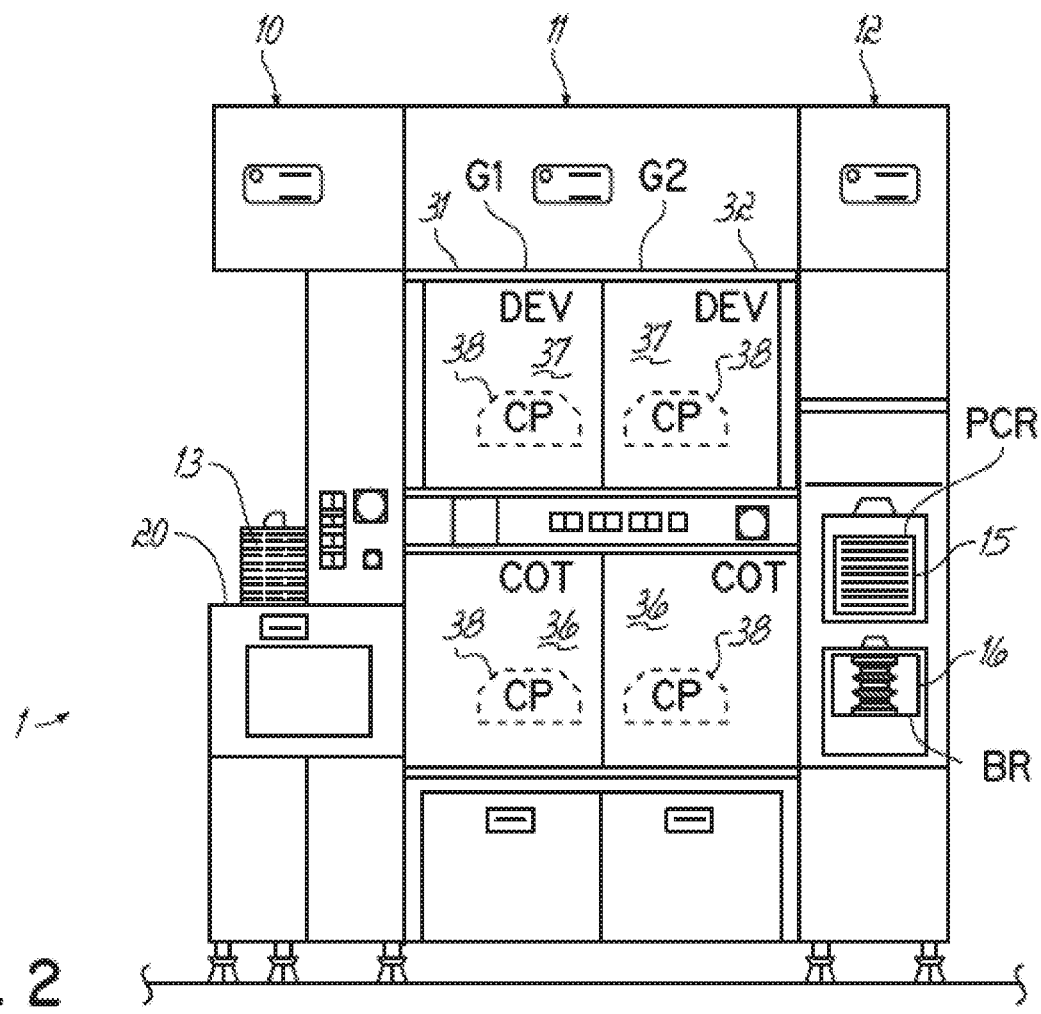
FIG. 2 (PRIOR ART) is a front view of the substrate processing system shown in FIG. 1.
Figure 3:
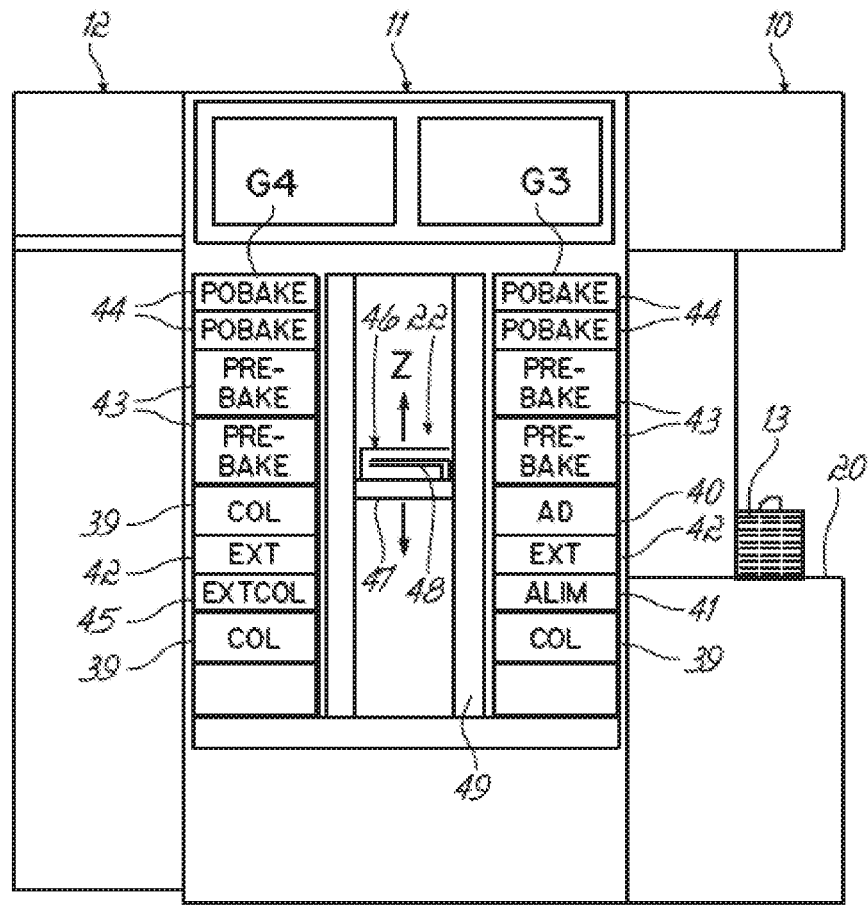
FIG. 3 (PRIOR ART) is a partially cut-away back view of the substrate processing system shown in FIG. 1, as taken along line 3-3.

FIGS. 1-3 (Prior Art) are initially described and provide example substrate processing systems in which the monitoring techniques described herein may be incorporated. As shown in FIGS. 1-3, substrate processing system 1 may include various components for processing substrates (e.g., semiconductor wafers) including components configured to apply liquid solutions to a substrate, thermally treat (i.e., bake) a substrate and develop a substrate.

It is noted that the substrate processing system 1 shown in FIGS. 1-3 is merely one example processing system in which the monitoring techniques described herein may be used. Thus, the disclosure of the processing system shown in FIGS. 1-3 is not meant to be limiting, but rather merely representative of one example processing system within which the monitoring techniques described herein may be utilized. Further, though the processing system of FIGS. 1-3 is described with reference to a system for processing substrates, which may in some embodiments be semiconductor wafers, it will be recognized that the techniques described herein may be utilized when processing other types of substrates. Thus, it will be recognized that the monitoring techniques described herein may be utilized within a wide range of substrate processing systems that apply liquid solutions, thermally treat and/or develop substrates.

With reference to FIGS. 1-3, substrate processing system 1 may generally include a load/unload section 10, a process section 11, and an interface section 12. The load/unload section 10 has a cassette table 20 on which cassettes 13, each storing a plurality of semiconductor wafers (W) 14 (e.g., 25), are loaded and unloaded from substrate processing system 1. The process section 11 has various single wafer processing units for processing the wafer 14 sequentially one by one. These processing units are arranged in predetermined positions of multiple stages, for example, within first (G1), second (G2), third (G3), fourth (G4) and fifth (G5) process unit group 31, 32, 33, 34, 35. The interface section 12 is interposed between the process section 11 and one or more light exposure systems (not shown), and is configured to transfer resist coated wafers between the process sections. The one or more light exposure systems can include a resist patterning system, such as a photolithography tool that transfers the image of a circuit or a component from a mask or onto a resist on the wafer surface.

As shown in FIG. 1, the load/unload section 10 includes a plurality of projections 20a, which are formed on the cassette table 20 and used to orient each of the plurality of cassettes 13 relative to the process section 11. Each of the cassettes 13 mounted on the cassette table 20 has a load/unload opening 9 facing the process section 11. The load/unload section 10 further includes a first sub-arm mechanism 21 that is responsible for loading/unloading the wafer W into/from each of the cassettes 13. The first sub-arm mechanism 21 has a holder portion for holding the wafer 14, an X-axis moving mechanism (not shown) for moving the holder portion in an X-axis direction, a Y-axis moving mechanism (not shown) for moving the holder portion in a Y-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment (ALIM) unit 41 and an extension (EXT) unit 42 belonging to a third (G3) process unit group 33, as shown in FIG. 3 and described further below.

As shown in FIGS. 1 and 3, a main arm mechanism 22 is liftably arranged at the center of the process section 11 to transfer a wafer 14 between the process unit groups G1-G5, which are arranged around the main arm mechanism 22. The main arm mechanism 22 is arranged within a cylindrical supporting body 49 of process section 11 and has a liftable wafer transporting system 46. The cylindrical supporting body 49 is connected to a driving shaft of a motor (not shown). The driving shaft may be rotated about the Z-axis in synchronism with the liftable wafer transporting system 46 by an angle of θ. The wafer transporting system 46 has a plurality of holder portions 48, which are movable in a front and rear direction of a transfer base table 47.

As shown in FIG. 1, a movable pick-up cassette (PCR) 15 and a non-movable buffer cassette (BR) 16 are arranged in two stages at the front side of the interface section 12. At the backside of the interface section 12, a peripheral light exposure system 23 is arranged. The peripheral light exposure system 23 may contain, for example, a lithography tool. Alternately, the lithography tool may be remote to, and cooperatively coupled to, the substrate processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension (EXT) unit 42 located in the fourth (G4) process unit group 34 but also to a wafer transfer table (not shown) near a remote light exposure system (not shown).

As shown in FIG. 1, processing units belonging to first (G1) and second (G2) process unit groups 31, 32, are arranged at a front portion 2 of the substrate processing system 1. Processing units belonging to the third (G3) process unit group 33 are arranged next to the load/unload section 10. Processing units belonging to the fourth (G4) process unit group 34 are arranged next to the interface section 12. Processing units belonging to the fifth (G5) process unit group 35 are arranged in a back portion 3 of the substrate processing system 1. As noted above, main arm mechanism 22 is arranged centrally between process unit groups G1-G5, and configured to transfer a wafer 14 between various processing units within process unit groups G1-G5.

With specific reference to FIG. 2, the first (G1) process unit group 31 and the second (G2) process unit group 32 each include two spinner-type processing units (i.e., liquid dispense units) for applying a predetermined treatment to the wafer 14, which is mounted on a spin chuck (not shown in FIG. 2) within a cup (CP) 38. For example, the first (G1) process unit group 31 and the second (G2) process unit group 32 may each include a resist coating unit (COT) 36 and a developing unit (DEV) 37, which are stacked in two stages sequentially from the bottom, as shown in FIG. 2. In the exemplary system shown in FIG. 2, the resist coating unit (COT) 36 is set at a lower stage than the developing unit (DEV) 37 because a drain line (not shown in FIG. 2) for the resist waste solution is desired to be shorter than a drain line (not shown in FIG. 2) for the developing waste solution for the reason that the resist waste solution is more difficult to discharge than the developing waste solution. However, if necessary, the resist coating unit (COT) 36 may be arranged at an upper stage relative to the developing unit (DEV) 37.

With specific reference to FIG. 3, the third (G3) process unit group 33 has a cooling (COL) unit 39, an alignment (ALIM) unit 41, an adhesion (AD) unit 40, an extension (EXT) unit 42, two prebaking (PREBAKE) units 43, and two postbaking (POBAKE) units 44, which are stacked sequentially from the bottom. Similarly, the fourth (G4) process unit group 34 has a cooling (COL) unit 39, an extension-cooling (EXTCOL) unit 45, an extension (EXT) unit 42, another cooling (COL) unit 39, two prebaking (PREBAKE) units 43 and two postbaking (POBAKE) units 44 stacked sequentially from the bottom. Although, only two prebaking units 43 and only two postbaking units 44 are shown, the third (G3) process unit group 33 and the fourth (G4) process unit group 34 may contain substantially any number of prebaking units 43 and postbaking units 44. Furthermore, any or all of the prebaking units 43 and postbaking units 44 may be configured to perform a bake process, such as a Post Apply Bake (PAB) process, a Post Exposure Bake (PEB) process, an Electrostatic Post Exposure Bake (EPEB) process, a Post Development Bake (PDB) process, etc.

In some implementations, the cooling (COL) unit 39 and the extension cooling (EXTCOL) unit 45 are operated at low processing temperatures and arranged at lower stages, and the prebaking (PREBAKE) unit 43, the postbaking (POBAKE) unit 44 and the adhesion (AD) unit 40 are operated at high temperatures and arranged at the upper stages. Although thermal interference between units may be reduced with this arrangement, these units may have different arrangements in other implementations. In one exemplary implementation, the prebaking (PREBAKE) unit 43, the postbaking (POBAKE) unit 44, and the adhesion (AD) unit 40 can each include a bake unit in which wafer 14 is heated to temperatures above room temperature.

With specific reference to FIG. 1, the fifth (G5) process unit group 35 may be arranged at the back portion 3 of the backside of the main arm mechanism 22. The fifth (G5) process unit group 35 may be slidably shifted in the Y-axis direction along a guide rail 25. Since the fifth (G5) process unit group 35 may be shifted as mentioned, maintenance operation may be applied to the main arm mechanism 22 easily from the backside.

As mentioned above, the system of FIGS. 1-3 is merely exemplary and the monitoring techniques described herein may be applied to a wide range of substrate processing systems, all as would be recognized by one skilled in the art. In some embodiments, the resist coating (COT) units 36 and developing (DEV) units 37 shown in FIG. 2 and described above may be utilized to apply layers or films, such as spin-on hard masks, imaging layers (e.g., photoresist), anti-reflective coating layers (e.g., silicon anti-reflective coating (SiARC), topcoat antireflective (TARC) layers, bottom anti-reflective coating (BARC) layers), etc., to a surface of a wafer. In some embodiments, additional coating units and/or developing units may be provided for applying other layers utilized in a photolithography process. In some embodiments, the prebaking units 43 and postbaking units 44 shown in FIG. 2 and described above may be utilized to bake, cure or harden the layers or films applied to the wafer. In some embodiments, additional baking units may be provided for thermally treating other layers utilized in a photolithography process.

The present disclosure provides various embodiments of substrate processing system which utilize a substrate inspection system and method that may be used to monitor characteristics of a substrate. In the disclosed embodiments, the substrate inspection system (in one exemplary embodiment, a wafer inspection system, WIS) is integrated within a substrate processing system and includes one or more optical sensors and a controller. Optical sensors suitable for use within the substrate inspection system disclosed herein include, but are not limited to, any optical sensors utilized with reflectometers. The reflectometers utilized may be any of a wide variety of reflectometers. The description herein provides specific exemplary reflectometers that are spectrometers and laser-based transceivers. However, it will be recognized that the use of spectrometers and laser-based transceivers are merely exemplary reflectometers and the techniques described herein are not limited to those types of reflectometers.

Unlike conventional wafer inspection systems, reflectometer(s) (for example spectrometer(s) or laser-based transceivers) are included within the disclosed WIS and are configured to obtain spectral data from a substrate, while the substrate is disposed within, or in the process of being transferred into/out of, a processing unit (e.g., a liquid dispense unit, a baking unit or a combined bake module) of a substrate processing system. By positioning the reflectometer (or reflectometer inputs) at various locations within the substrate processing system, a significant amount of spectral data can be collected by the spectrometer(s) or laser-based transceiver(s) while a substrate is being processed, or immediately after processing is complete (such as, e.g., during substrate retrieval). In addition to obtaining spectral data at various locations within the substrate processing system, the fast integration times provided by the spectrometer(s) and laser-based transceiver(s) enable high spatial resolution spectral data to be provided to the controller.

The controller included within the disclosed WIS receives the spectral data from the spectrometer(s) or laser-based transceiver(s) and analyzes the spectral data to monitor one or more characteristics of the substrate. Although not strictly limited to such, the characteristics monitored by the controller may include a film thickness (FT) of a layer applied to a surface of the substrate, refractive index changes of a film, and/or associated critical dimension (CD) changes of a structure formed on the substrate. In addition, by analyzing the spectral data while the substrate is disposed within, or in the process of being transferred into/out of, a processing unit, the controller is able to feed inspection results forward to a fault detection or APC system in real time.

In some embodiments of the present disclosure, one or more spectrometers or laser-based transceivers (or spectrometer/transceiver inputs) may be coupled at various locations within a substrate processing system including locations within, and/or outside of, one or more processing units (e.g., a liquid dispense unit, a baking unit or a combined bake module) of the substrate processing system.

In some implementations, a spectrometer suitable for use with the disclosed WIS may include plurality of spectral sensors, which are mounted together alongside a variety of light sources (e.g., visible, ultra-violet (UV), laser diodes, and infrared (IR) LEDs) at one or more of these locations. One example of a spectrometer that may be coupled in such a manner is a Triad Spectroscopy Sensor provided by SparkFun. It is noted, however, that the spectrometer(s) disclosed herein are not limited to such an example and may be alternatively implemented in other embodiments.

Some of the monitoring techniques disclosed herein (e.g., film thickness monitoring, especially for materials greater than 2.5 um thick) may benefit from spectral range reduction, and thus, a small, laser-based transceiver may be preferred over a spectrometer. In some embodiments, a laser-based transceiver suitable for use with the disclosed WIS may include a visible or infrared laser light source (i.e., a laser-based transmitter such as a laser diode), which is mounted along with a visible or infrared receiver at one or more of the locations mentioned above. One example of a laser-based transceiver that may be coupled in such a manner is an LV series laser sensor provided by Keyence, which may transmit and receive narrowband laser light within the visible red (e.g., approximately 700-635 nm) and infrared (e.g., approximately 700 nm-1 mm) wavelength ranges. It is noted, however, that the laser-based transceiver(s) disclosed herein are not limited to such an example and may be alternatively implemented in other embodiments.

In other embodiments of the present disclosure, one or more optical fibers (acting as spectrometer/transceiver inputs) may be coupled at various locations within a substrate processing system including locations within, and/or outside of, one or more processing units (e.g., a liquid dispense unit, a baking unit or a combined bake module) of the substrate processing system. In such embodiments, the optical fiber(s) may be communicatively coupled to the remaining spectrometer/transceiver hardware located elsewhere. One example of a spectrometer that may be coupled in such a manner is a modular Universal Serial Bus (USB) spectrometer provided by Ocean Optics. Modular USB spectrometers are versatile, general-purpose UV-Visible-NIR spectrometers that can be used for absorption, transmission, reflectance, emission, and color applications. Due to their compact size and fiber optic parts assembly, modular USB spectrometers can be integrated into tight spaces. One example of a laser-based transceiver that may be coupled in such a manner is an LV series general purpose digital laser sensor provided by Keyence. It is noted, however, that the spectrometer(s)/transceiver(s) disclosed herein are not limited to such an example and may be alternatively implemented in other embodiments.

Figure 4A:
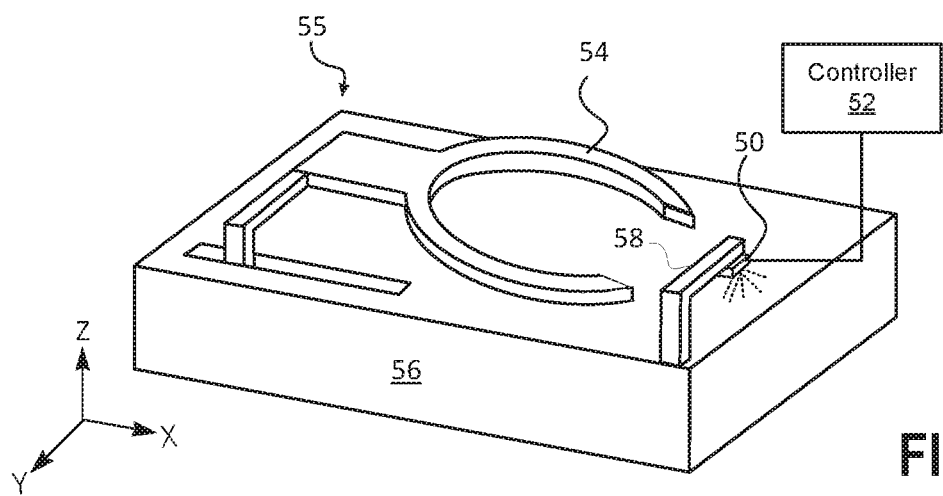
FIG. 4A is a perspective view illustrating a first embodiment of a wafer inspection system (WIS) including one or more optical sensors and a controller, where the optical sensor(s) are coupled to a main arm mechanism used to transfer a substrate between processing units of a substrate processing system.
Figure 4B:
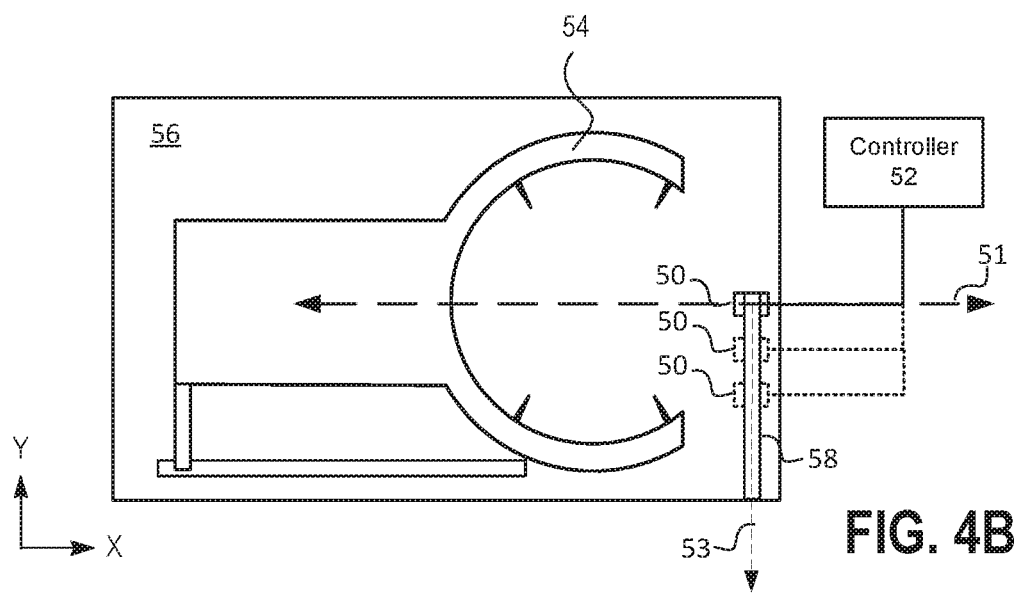
FIG. 4B is a top view of the WIS and main arm mechanism shown in FIG. 4A.
Figure 4C:
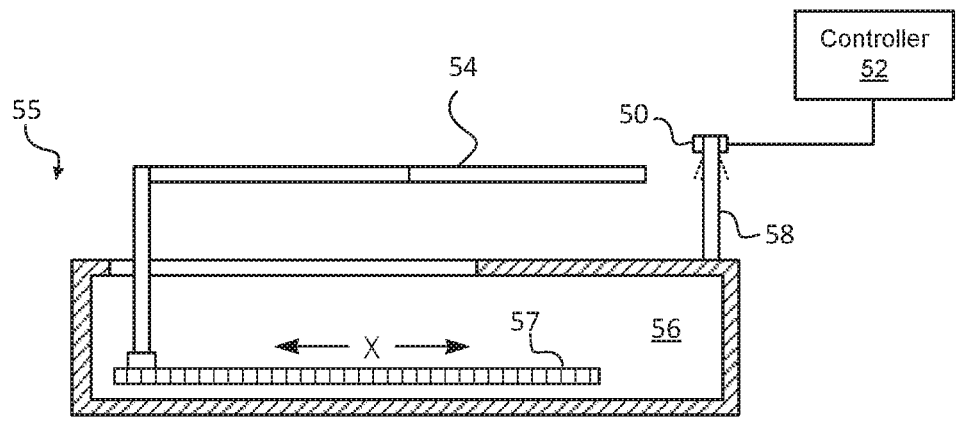
FIG. 4C is a side view of the WIS and main arm mechanism shown in FIGS. 4A and 4B.

FIG. 4A is a perspective view illustrating a first embodiment of a wafer inspection system (WIS) in accordance with the present disclosure. FIG. 4B is a top view and FIG. 4C is a side view of the WIS shown in FIG. 4A. The WIS shown in FIGS. 4A-4B includes one or more optical sensors 50 coupled to obtain spectral data from a substrate (not shown), and a controller 52 coupled to receive the spectral data from the spectrometer(s). In the particular embodiment shown in FIGS. 4A-4B, optical sensors(s) 50 are coupled to one end (e.g., a substrate retrieval end) of a main arm mechanism 55, which is used to transfer a substrate between two or more processing units of a substrate processing system. The optical sensor(s) 50 shown in FIGS. 4A-4B may be implemented with spectrometer(s) or laser-based transceiver(s), as discussed above.

In some embodiments, the main arm mechanism 55 shown in FIGS. 4A-4B may be used to implement the main arm mechanism 22 in the substrate processing system 1 shown in FIGS. 1 and 3. As noted above, main arm mechanism 22 is centrally arranged between a plurality of process unit groups G1-G5, and is configured to transfer substrates between two or more processing units included within the process unit groups G1-G5. It is noted, however, that main arm mechanism 55 is not limited to the main arm mechanism 22 shown in FIGS. 1 and 3, and may be used to implement other processing arms within substrate processing system 1, or processing arms within other substrate processing systems.

In the simplified version shown in FIGS. 4A-4B, main arm mechanism 55 includes at least one substrate holder 54, a subassembly 56 and a bracket 58. The at least one substrate holder 54, which is coupled to subassembly 56, may be configured to pick up and transport one or more substrates between two or more processing units of a substrate processing system. In some embodiments, only one substrate holder 54 may be coupled to subassembly 56, as shown in FIGS. 4A-4B, for transferring one substrate at a time. In other embodiments, multiple substrate holders (not shown) may be coupled to subassembly 56 and stacked vertically in the Z-direction for potentially transferring multiple substrates at a time.

Subassembly 56 enables substrate holder 54 to move in a linear direction (e.g., the X-direction), so that the substrate holder can pick up and transport substrates. In some embodiments, substrate holder 54 may slide along a linear guide rail 57 disposed within subassembly 56, as shown for example in FIG. 4C. In other embodiments, an alternative mechanism may be disposed within or coupled to subassembly 56 to provide linear motion to the substrate holder 54.

Bracket 58 is coupled to subassembly 56 near one end (e.g., substrate retrieval end) of the main arm mechanism 55. In the embodiments shown in FIGS. 4A-4C, one or more optical sensors 50 are coupled to the bracket 58. It will be recognized that alternatively, one or more optical sensor inputs (for example optical fibers) could be coupled to the bracket 58. Thus, in each embodiment shown herein optical sensors or merely optical sensor inputs may be coupled to various locations of the substrate processing system. Thus, the embodiments shown are not meant to be limited to a whole optical sensor unit, or an input to such a unit, but meant merely to be exemplary of either option. In some embodiments (see, e.g., FIG. 4A), a single optical sensor 50 may be coupled to bracket 58, such that the optical sensor is centered along a substrate retrieval axis 51 and positioned so that light emitted from the spectrometer or laser based transceiver is directed downwards in a direction (e.g., the Z-direction) normal to the substrate plane. When positioned in such a manner, a single optical sensor 50 may be used to obtain a line scan of spectral data from an upper surface of a substrate as the substrate is loaded into or retrieved from a processing unit (e.g., a liquid dispense unit, a baking unit or a combined bake module) of the substrate processing system. The line scan of spectral data may be provided to controller 52 for processing.

In other embodiments (see, e.g., FIG. 4B), multiple optical sensors 50 can be arranged along an axis 53, which is perpendicular to the substrate retrieval axis 51, and positioned so that light emitted from the optical sensors is directed downwards in a direction (e.g., the Z-direction) normal to the substrate plane. As a substrate is loaded into or retrieved from a processing unit (e.g., a liquid dispense unit, a baking unit or a combined bake module), each of the multiple optical sensors 50 may be used to obtain a line scan of spectral data from an upper surface of the substrate. By combining the line scans from multiple optical sensors 50, a grid of spectral data (in both the substrate retrieval axis 51 and the perpendicular axis 53) can be provided to controller 52 for processing.

In other embodiments, one or more optical fibers (not shown) may be coupled to bracket 58 in lieu of the one or more optical sensors 50 shown in FIGS. 4A-4C. As noted above, the one or more optical fibers may be communicatively coupled to remotely located other spectrometer and/or laser based transceiver hardware for transmitting light between the other optical sensor hardware and the substrate surface. If a single optical fiber is used, the optical fiber may be centered along the substrate retrieval axis 51 and positioned so that light emitted from the optical fiber is directed downwards in a direction (e.g., the Z-direction) normal to the substrate plane. If multiple optical fibers are used, the optical fibers may be arranged along the axis 53, which is perpendicular to the substrate retrieval axis 51, and positioned so that light emitted from the optical fibers is directed downwards in a direction (e.g., the Z-direction) normal to the substrate plane. As a substrate is loaded into or retrieved from a processing unit (e.g., a liquid dispense unit, a baking unit or a combined bake module), light emitted from the optical fiber(s) is reflected from the upper surface of the substrate and communicated to at least one remotely located optical sensor, which may or may not be coupled to the main arm mechanism 55. The at least one optical sensor obtains spectral data from the light propagated through the optical fiber(s) and provides the spectral data to controller 52 for processing.

Figure 5A:
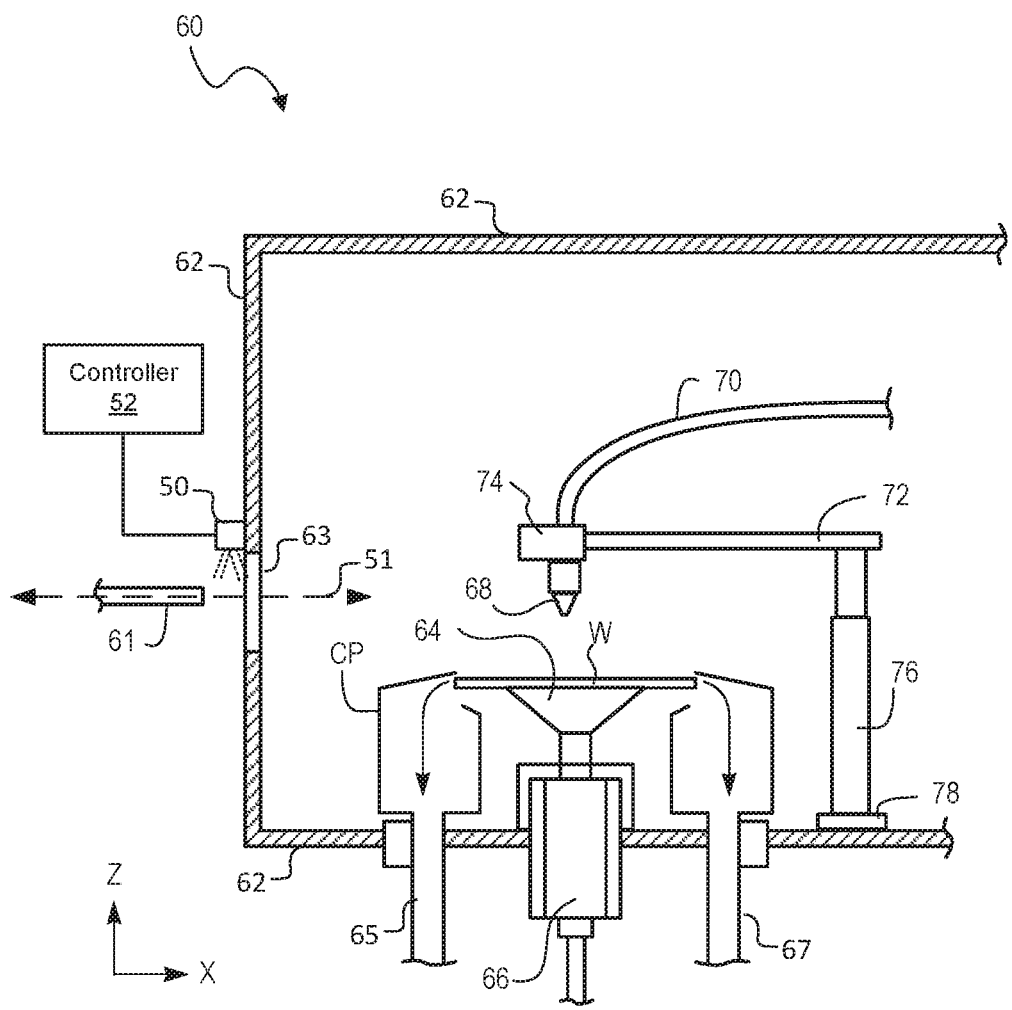
FIG. 5A is a side view illustrating a second embodiment of a WIS including one or more optical sensors and a controller, where the optical sensor(s) are coupled to a processing unit (e.g., a liquid dispense unit) of a substrate processing system and positioned above a loading/unloading opening of the processing unit.
Figure 5B:
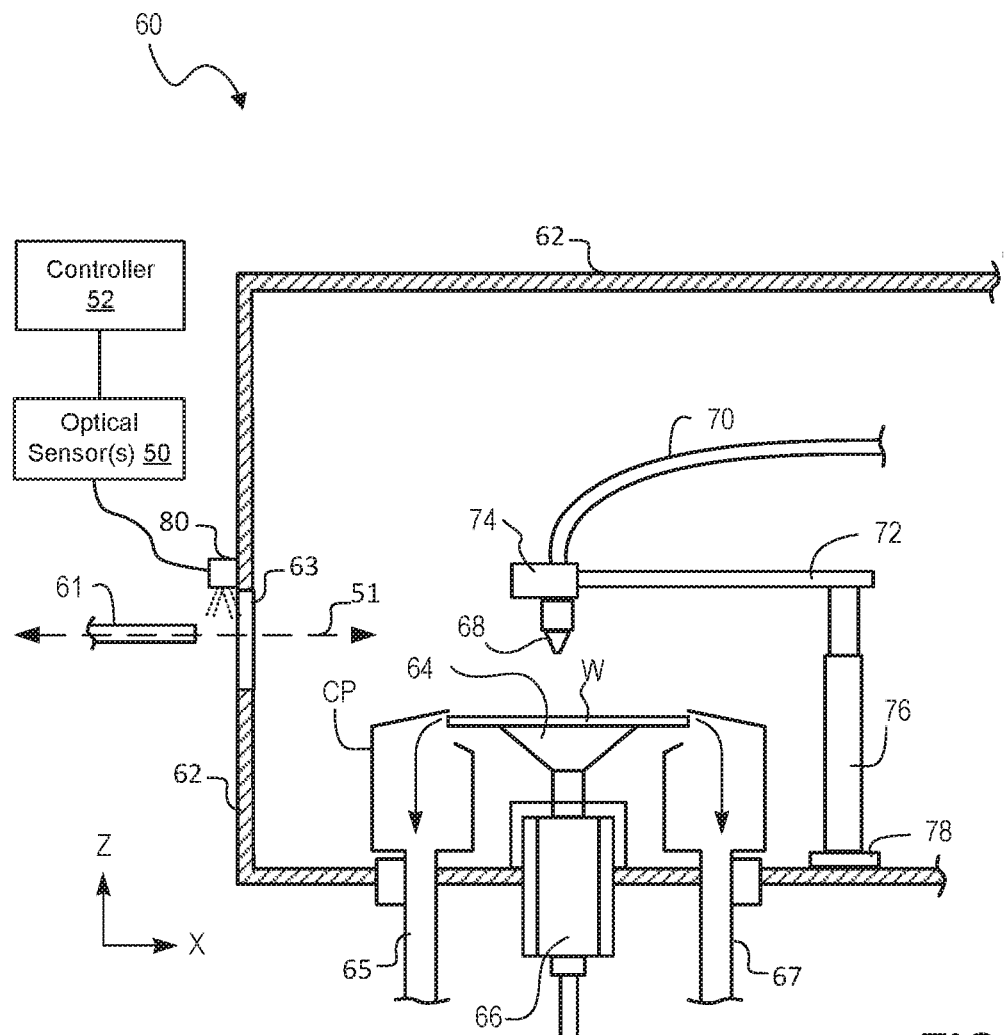
FIG. 5B is a side view illustrating a third embodiment of a WIS including one or more optical sensors and a controller, where one or more optical fibers communicatively coupled to the optical sensor(s) are positioned above the loading/unloading opening of a processing unit (e.g., a liquid dispense unit) of a substrate processing system.
Figure 5C:
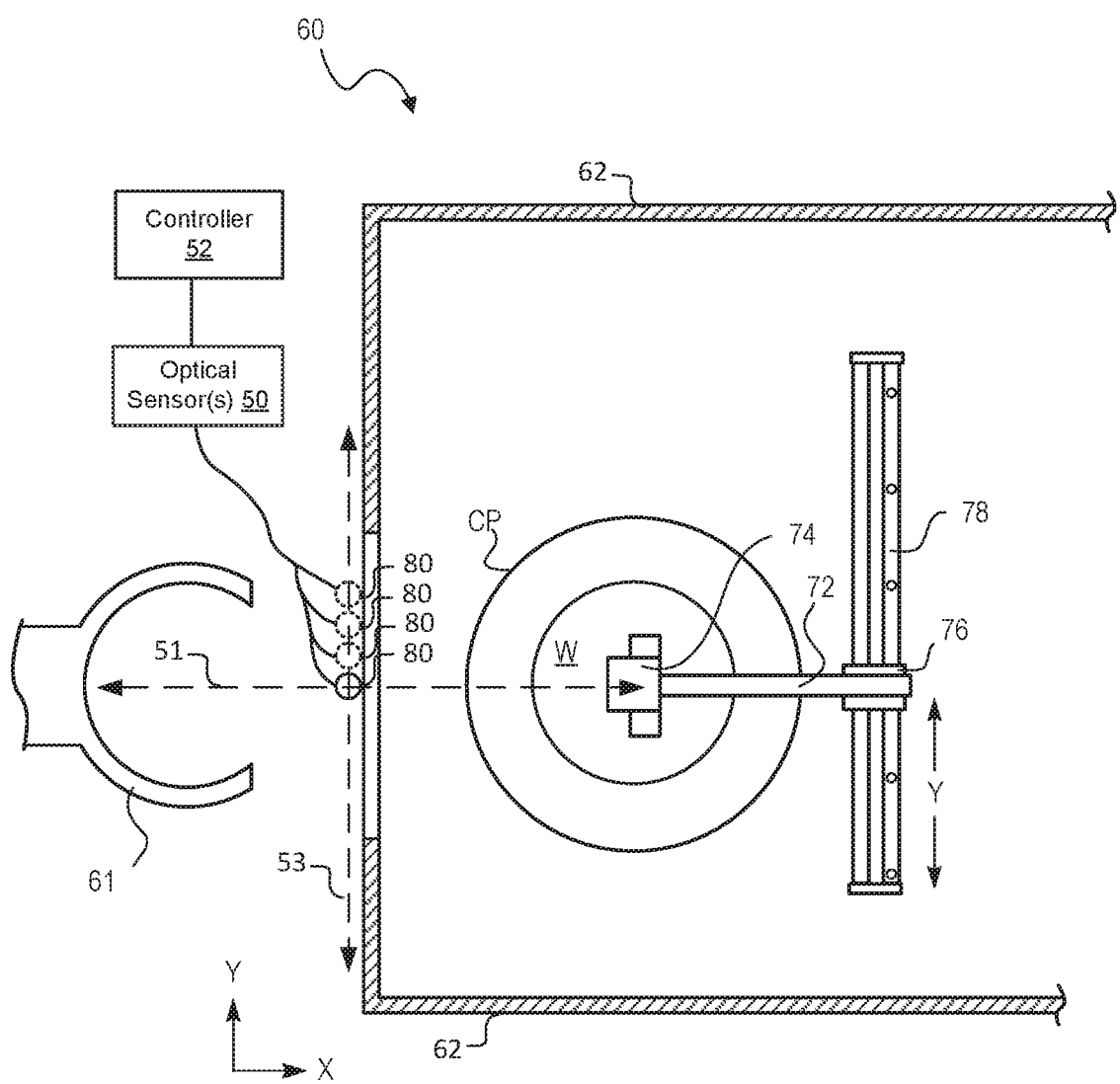
FIG. 5C is a top view of the WIS and processing unit shown in FIG. 5B.

FIG. 5A is a side view illustrating a second embodiment of a substrate inspection system in accordance with the present disclosure. FIG. 5B is side view and FIG. 5C is a top view illustrating a third embodiment of a substrate inspection system in accordance with the present disclosure. Like the previous embodiments shown in FIGS. 4A-4C and described above, the embodiments shown in FIGS. 5A-5C may generally include one or more optical sensors 50 (and/or one or more optical fibers 80), which are coupled to obtain spectral data from a substrate (such as wafer W), and a controller 52 which is coupled to receive the spectral data from the spectrometer(s). The optical sensor(s) 50 shown in FIGS. 5A-5C may be implemented with spectrometer(s) or laser-based transceiver(s), as discussed above.

In the embodiment shown in FIG. 5A, one or more optical sensor 50 are coupled to and positioned above a loading/unloading opening 63 of a processing unit (e.g., liquid dispense unit 60) of a substrate processing system. In the embodiment shown in FIGS. 5B-5C, one or more optical fibers 80 are coupled to and positioned above the loading/unloading opening 63 of liquid dispense unit 60. Although a liquid dispense unit (e.g., a coating unit or a develop unit) is shown in FIGS. 5A-5C, it is noted that one or more optical sensors 50 (or one or more optical fibers 80) may be alternatively coupled to and positioned above a loading/unloading opening 63 of other processing units, such as a baking unit, a combined bake module, a plasma module, etc.

FIGS. 5A-5C illustrate an exemplary liquid dispense unit 60, which may be utilized for various liquid dispense stations (such as, for example, resist coating unit (COT) 36 and/or developing unit (DEV) 37) within which liquids are applied to a substrate for processing purposes. It is recognized that the liquid dispense unit 60 shown in FIGS. 5A-5C is merely one example of a processing unit within which the monitoring techniques described herein may be applied. Thus, the techniques disclosed herein may be applied to other liquid dispense units and/or other processing units.

Substrates are coated with various processing liquids in liquid dispense unit 60, which may be part of, for example, resist coating unit (COT) 36, developing unit (DEV) 37 or other liquid dispense units (e.g., spin-on hard mask units, spin-on anti-reflective coating units, etc.). As shown in FIGS. 5A-5C, liquid dispense unit 60 includes a processing chamber, which is bounded by a chamber wall 62. A spin chuck 64 disposed inside chamber wall 62 provides support for a substrate, which may in some embodiments, be a semiconductor wafer (W). More specifically, the spin chuck 64 has a horizontal upper surface on which the substrate is supported during processing. A suction port (not shown) may be provided in the horizontal upper surface of spin chuck 64 for securing the substrate to the spin chuck with suction. The spin chuck 64, and the substrate supported by the spin chuck 64, may be rotated at a variable angular velocity by a drive mechanism 66, which may be a stepper motor, etc. The drive mechanism 66 may operate at various angular velocities for the application of the liquid material and flow of the liquid material onto the substrate.

A nozzle 68 is adapted to dispense one or more liquid solutions onto the substrate at a specified rate to apply one or more layers or films onto an upper surface of the substrate. Typical layers or films that may be applied to the substrate surface include, but are not limited to, topcoat (TC) barrier layers, topcoat antireflective (TARC) layers, bottom antireflective (BARC) layers, imaging layers (e.g., photoresist) and sacrificial and barrier layers (hard mask) for etch stopping. The nozzle 68 is coupled to a liquid supply unit (not shown) through a liquid supply line 70. In some embodiments, nozzle 68 may be attached to the leading end of a nozzle scan arm 72 through a nozzle holder 74. The nozzle scan arm 72 is mounted at the upper end portion of a vertical support member 76 that is horizontally movable on a guide rail 78 in one direction (e.g., in the Y-direction). Although not shown in FIG. 5A, a drive mechanism (not shown) may be coupled to the nozzle scan arm 72, the vertical support member 76 or the guide rail 78 to move the nozzle 68 in the Y-direction. Other mechanisms (also not shown) can be used to move the nozzle 68 in the Z-direction and/or in the X-direction.

A cup (CP) is provided to capture and collect a majority of the liquid material ejected from the substrate by centrifugal forces generated during rotation by the spin chuck 64. The spin chuck 64 supports and rotates (i.e., spins) the substrate about its central normal axis relative to the cup, which is stationary. Liquid material ejected from the substrate and collected by the cup is drained via a drain line 65 and drain unit (not shown). In some embodiments, an exhaust line 67 and exhaust unit (no shown), such as a vacuum pump or other negative pressure-generating device, may also be used to removes gaseous species (including but not limited to vapors released from substrate layers during processing) from the processing space inside the cup.

Spin chuck 64 and drive mechanism 66 are disposed within an opening in the cup (CP). In some embodiments, an elevation mechanism, such as an air cylinder and an up-and-down guide unit, may be provided within drive mechanism 66 so the spin chuck 64 may move vertically relative to the chamber wall 62. The substrate can be delivered to the spin chuck 64 by a processing arm 61, which may form a part of a substrate transfer mechanism (not shown in FIGS. 5A-5C). In some embodiments, the processing arm 61 may be included within the main arm mechanism 22 shown in FIGS. 1 and 3 and/or the main arm mechanism 55 shown in FIGS. 4A-4C. In other embodiments, the processing arm 61 may be included within other substrate processing systems. In some embodiments, the elevation mechanism can lift the drive mechanism 66 and/or the spin chuck 64 upwards to receive a substrate. Alternatively, the cup (CP) may be configured to move up-and-down, or may be configured to separate and widen, to allow a substrate to be placed on the spin chuck 64.

In the embodiment shown in FIG. 5A, one or more optical sensors 50 are coupled to and positioned above a loading/unloading opening 63 of liquid dispense unit 60. In some embodiments, a single optical sensor 50 may be coupled above the loading/unloading opening 63, such that the optical sensor is centered along a substrate retrieval axis 51 and positioned so that light emitted from the optical sensor is directed downwards in a direction (e.g., the Z-direction) normal to the substrate plane. In other embodiments, multiple optical sensors 50 can be arranged along an axis (not shown), which is perpendicular to the substrate retrieval axis 51. When a single optical sensor 50 is positioned as shown in FIG. 5A, the optical sensor may be used to obtain a line scan of spectral data from an upper surface of a substrate as the substrate is loaded into or retrieved from liquid dispense unit 60 via the processing arm 61. When multiple optical sensors are included, a grid of spectral data (in both the substrate retrieval axis 51 and the perpendicular axis) can be obtained from the upper surface of the substrate as processing arm 61 loads/unloads the substrate into/out of the liquid dispense unit 60. The spectral data obtained from the optical sensor(s) 50 may be provided to controller 52 for processing.

In the embodiments shown in FIGS. 5B-5C, one or more optical fibers 80 are positioned above the loading/unloading opening 63 of liquid dispense unit 60 and communicatively coupled to a smaller subset of remotely located optical sensor(s) 50 for transmitting light between the optical sensor(s) and the substrate surface. When a single optical fiber 80 is positioned above the loading/unloading opening 63, the optical fiber may be centered along the substrate retrieval axis 51 and positioned so that light emitted from the optical fiber is directed downwards in a direction (e.g., the Z-direction) normal to the substrate plane. If multiple optical fibers 80 are included (see, e.g., FIG. 5C), the optical fibers may be arranged along the axis 53, which is perpendicular to the substrate retrieval axis 51, and positioned so that light emitted from the optical fibers is directed downwards in a direction (e.g., the Z-direction) normal to the substrate plane. As a substrate is loaded into or retrieved from liquid dispense unit 60, light emitted from the optical fiber(s) 80 is reflected from the upper surface of the substrate and communicated to optical sensor(s) 50. The optical sensor(s) 50 obtain spectral data from the light propagated through the optical fiber(s) 80 and provides the spectral data to controller 52 for processing.

Figure 6:
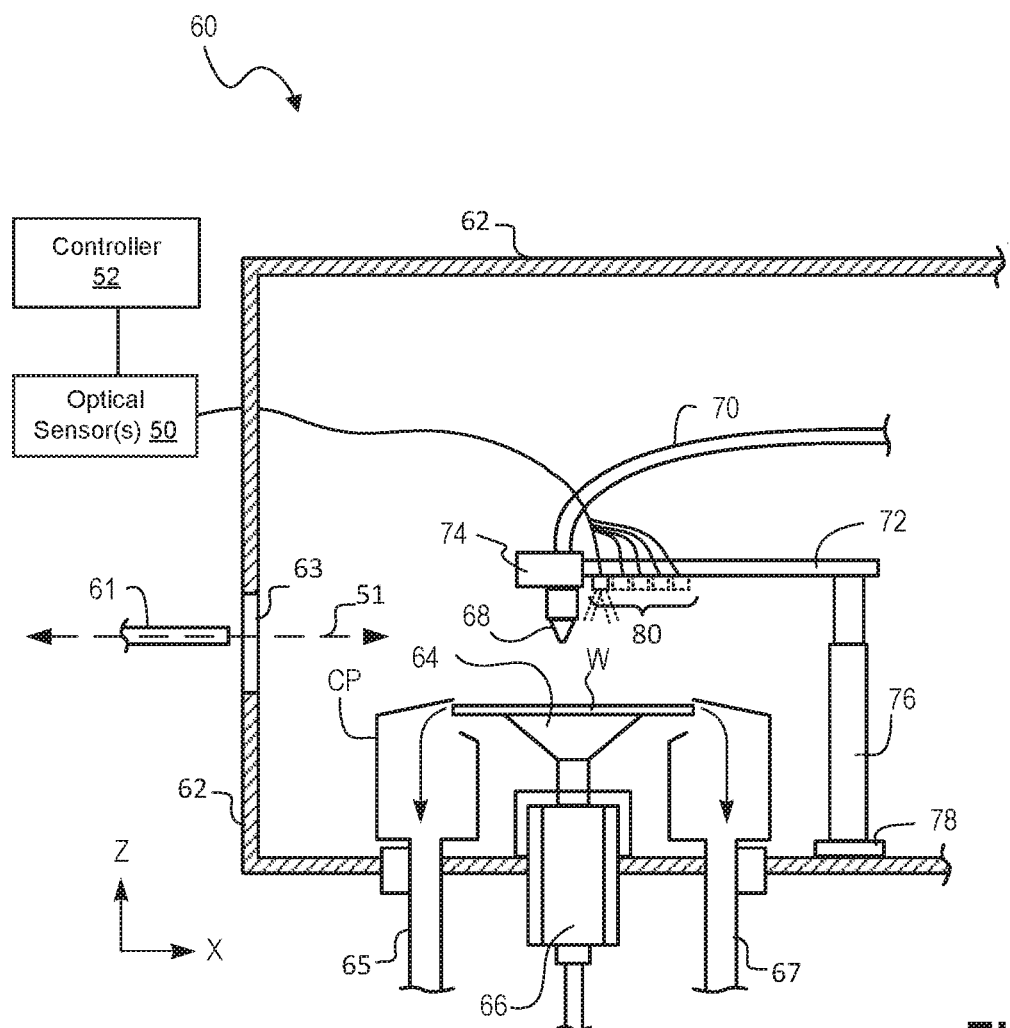
FIG. 6 is a side view illustrating a fourth embodiment of a WIS including one or more optical sensors and a controller, where one or more optical fibers communicatively coupled to the optical sensor(s) are coupled to a dispense arm disposed within a liquid dispense unit of a substrate processing system.

FIG. 6 is a side view illustrating a fourth embodiment of a substrate inspection system in accordance with the present disclosure. Like the previous embodiments shown in FIGS. 4A-5C the substrate inspection system shown in FIG. 6 may generally include one or more optical sensors 50 (and/or one or more optical fibers 80), which are coupled to obtain spectral data from a substrate (e.g., wafer W), and a controller 52 coupled to receive the spectral data from the spectrometer(s). The optical sensor(s) 50 shown in FIG. 6 may be implemented with spectrometer(s) or laser-based transceiver(s), as discussed above.

In the exemplary embodiment shown in FIG. 6, one or more optical fibers 80 are coupled to nozzle scan arm 72, which may be included within liquid dispense unit 60 for moving nozzle 68 in at least one direction (e.g., the Y-direction). Alternatively, optical fiber(s) 80 may be coupled to another dispense arm disposed within another liquid dispense unit of a substrate processing system. In yet another alternative, optical fibers are not utilized and full spectrometers or laser-based transceivers may be coupled to an arm of the system.

In the embodiment shown in FIG. 6, the one or more optical fibers 80 coupled to nozzle scan arm 72 are positioned above spin chuck 64 so that light emitted from the optical fiber(s) is directed downwards in a direction (e.g., the Z-direction) normal to the substrate plane. When a substrate (such as wafer W) is positioned on spin chuck 64, light emitted from the optical fiber(s) 80 is reflected from the upper surface of the substrate and communicated to optical sensor(s) 50. In some embodiments (not shown), one or more optical sensors may be coupled to nozzle scan arm 72 in lieu of the one or more optical fibers 80 shown in FIG. 6.

In the embodiment shown in FIG. 6, spectral data may be collected from a substrate during processing or immediately after. When multiple optical fibers 80 (or multiple optical sensors) are coupled to nozzle scan arm 72, optical sensor(s) 50 may obtain spectral data from the substrate at various radial positions as the spin chuck 64 rotates. When a single optical fiber 80 (or optical sensor) is coupled to nozzle scan arm 72, the linear movement of the nozzle scan arm combined with the spin chuck rotation may enable optical sensor 50 to collect spectral data in a variety of different ways (such as, e.g., a line scan, a spiral, a plurality of spokes, a plurality of concentric rings, etc.). The spectral data collected by optical sensor 50 may be provided to controller 52 for processing.

Figure 7:
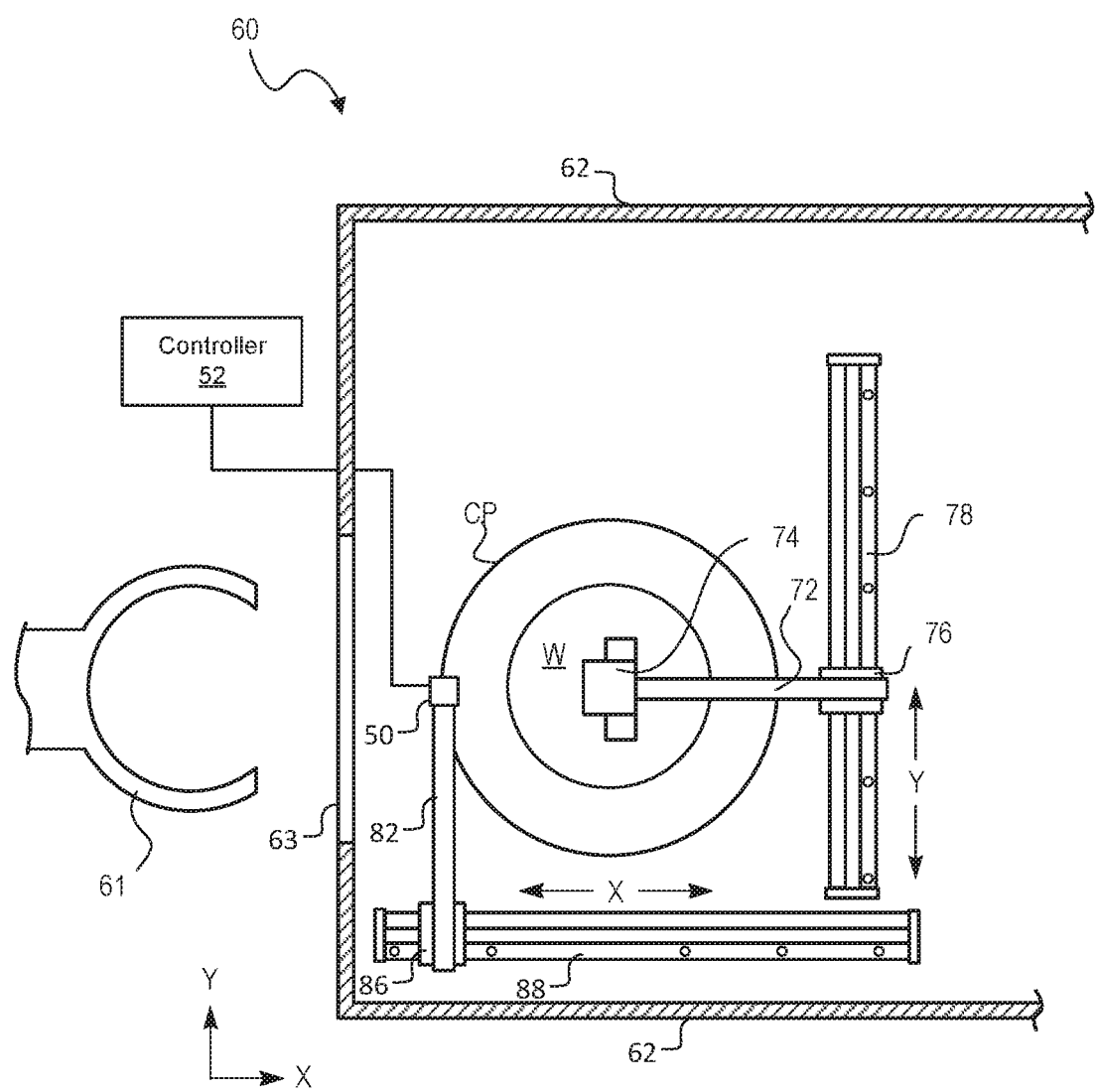
FIG. 7 is a top view illustrating a fifth embodiment of a WIS including one or more optical sensors and a controller, where the optical sensor(s) are coupled to another arm disposed within a liquid dispense unit of a substrate processing system.

FIG. 7 is a top view illustrating a fifth embodiment of a substrate inspection system in accordance with the present disclosure. Like the previous embodiments shown in FIGS. 4A-6, the system shown in FIG. 7 may generally include one or more optical sensors 50 (and/or one or more optical fibers), which are coupled to obtain spectral data from a substrate (e.g., wafer W), and a controller 52 coupled to receive the spectral data from the spectrometer(s). The optical sensor(s) 50 shown in FIG. 7 may be implemented with spectrometer(s) or laser-based transceiver(s), as discussed above.

In the particular embodiment shown in FIG. 7, one or more optical sensors 50 are coupled to an arm 82, which is disposed within liquid dispense unit 60, yet distinct from the nozzle scan arm 72 used to move nozzle 68. Alternatively, one or more optical fibers (not shown) may be coupled to arm 82 in lieu of the optical sensor(s) 50 shown in FIG. 7. When optical fiber(s) are coupled to arm 82, the optical fiber(s) may be communicatively coupled to remotely located other optical sensor hardware for transmitting light between the optical sensor(s) and substrate surface.

In the embodiment shown in FIG. 7, one or more optical sensors 50 are coupled near a distal end portion of arm 82. As shown in FIG. 7, arm 82 is mounted at the upper end portion of a vertical support member 86, which is horizontally movable on a guide rail 88 in one direction (e.g., in the X-direction). Although not shown in FIG. 7, a drive mechanism may be coupled to the arm 82, the vertical support member 86 or the guide rail 88 to translate or move the arm 82 in the X-direction. In some embodiments, another drive mechanism (not shown) can be used to move optical sensors 50 (for example spectrometer(s) and/or laser based transceivers) along a longitudinal axis of arm 82 (e.g., in the Y-direction).

In the embodiment shown in FIG. 7, spectral data may be collected from a substrate while the substrate is being processed or immediately after. When a substrate (such as wafer W) is positioned on spin chuck 64 referred to in FIGS. 5A-5C, light emitted from the optical sensor(s) 50 is reflected from the upper surface of the substrate and collected by the optical sensor(s) 50. The spectral data obtained from the reflected light may be measured in a variety of different ways (such as, e.g., a line scan, a spiral, a plurality of spokes, a plurality of concentric rings, etc.) depending on, for example, the movement of the optical sensor(s) 50 along the arm 82, the movement of the arm 82 itself, and the spin chuck 64 rotation.

Figure 8:
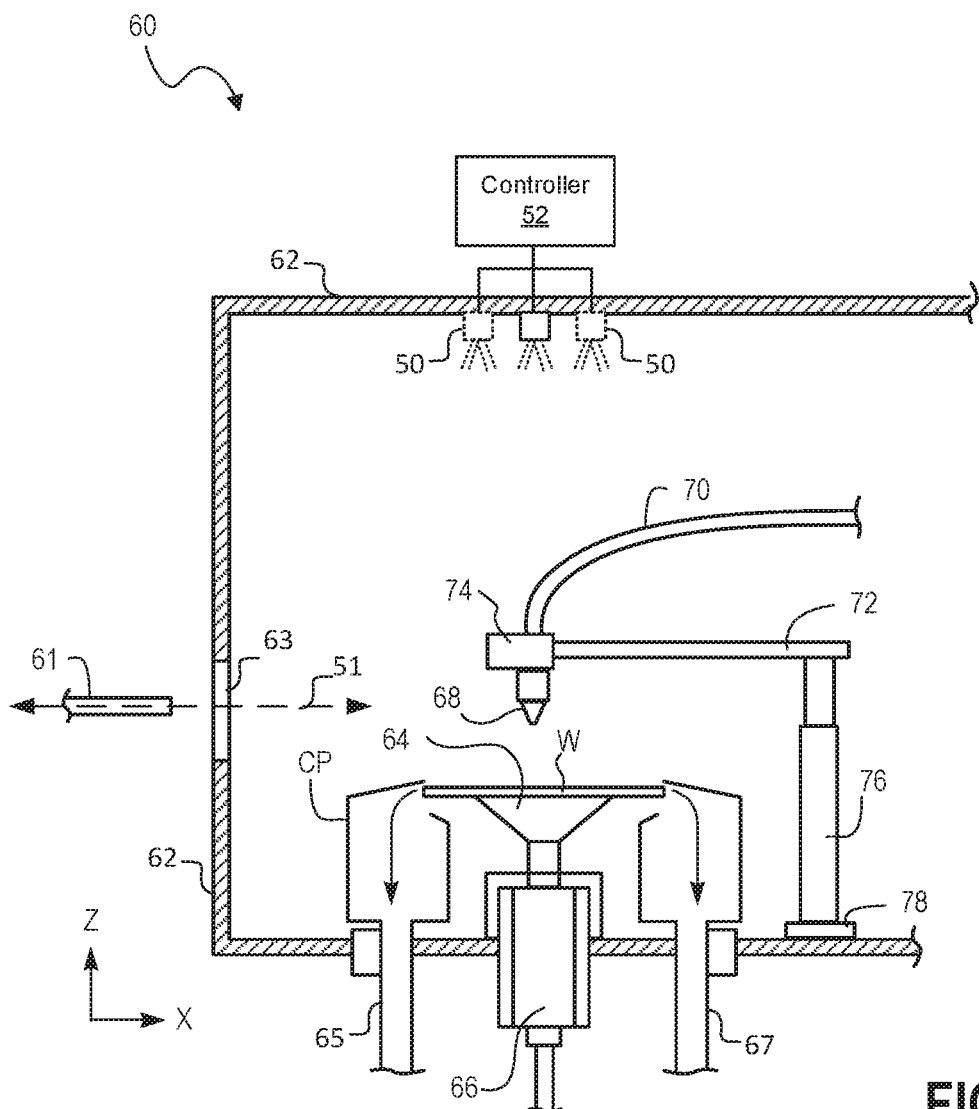
FIG. 8 is a side view illustrating a sixth embodiment of WIS including one or more optical sensors and a controller, where the optical sensor(s) are coupled to a ceiling of a liquid dispense unit of a substrate processing system.

FIG. 8 is a side view illustrating a sixth embodiment of a substrate inspection system in accordance with the present disclosure. Like the previous embodiments shown in FIG. 4A to FIG. 7, the system shown in FIG. 8 may generally include one or more optical sensors 50 (and/or one or more optical fibers), which are coupled to obtain spectral data from a substrate (e.g., wafer W), and a controller 52 coupled to receive the spectral data from the optical sensors (s) 50. The optical sensor(s) 50 shown in FIG. 8 may be implemented with spectrometer(s) or laser-based transceiver(s), as discussed above.

In the particular embodiment shown in FIG. 8, one or more optical sensors 50 are coupled to a ceiling of liquid dispense unit 60. Alternatively, one or more optical fibers (not shown) may be coupled to the ceiling of liquid dispense unit 60 in lieu of the optical sensors 50 shown in FIG. 8. When optical fiber(s) are coupled to the ceiling of liquid dispense unit 60, the optical fiber(s) may be communicatively coupled to a remotely located other optical sensor hardware for transmitting light between the optical sensor(s) 50 and the substrate surface.

In the embodiment shown in FIG. 8, the one or more optical sensors 50 are coupled to the ceiling of liquid dispense unit 60 and positioned above the spin chuck 64, so that light emitted from the optical sensor(s) is directed downwards in a direction (e.g., the Z-direction) normal to the substrate plane. In some embodiments, a single optical sensor 50 may be coupled to the ceiling of liquid dispense unit 60 and centered above the spin chuck 64. If multiple optical sensors 50 (or optical fibers) are included, the multiple optical sensors 50 may be arranged along the substrate retrieval axis 51 or along the axis (not shown) perpendicular to the substrate retrieval axis 51. Alternatively, the multiple optical sensors 50 (or optical fibers) may be arranged in substantially any configuration, as long as the optical sensors 50 (or optical fibers) are positioned above the spin chuck and directed towards the substrate plane.

In the embodiment shown in FIG. 8, spectral data may be collected from a substrate while the substrate is being processed or immediately after. When a substrate (such as wafer W) is positioned on spin chuck 64, light emitted from the optical sensor(s) 50 is reflected from the upper surface of the substrate and collected by the optical sensor(s) 50. The spectral data obtained from the reflected light may be measured in a variety of different ways (such as, e.g., a line scan, a spiral, a plurality of spokes, a plurality of concentric rings, etc.) depending on the arrangement of the optical sensor(s) 50 and the spin chuck 64 rotation. Unlike the previous embodiments shown in FIGS. 6 and 7, coupling one or more optical sensors (or optical fibers) to the ceiling of the liquid dispense unit 60 increases the field of view (FOV) of the optical sensor(s) 50.

Figure 9:
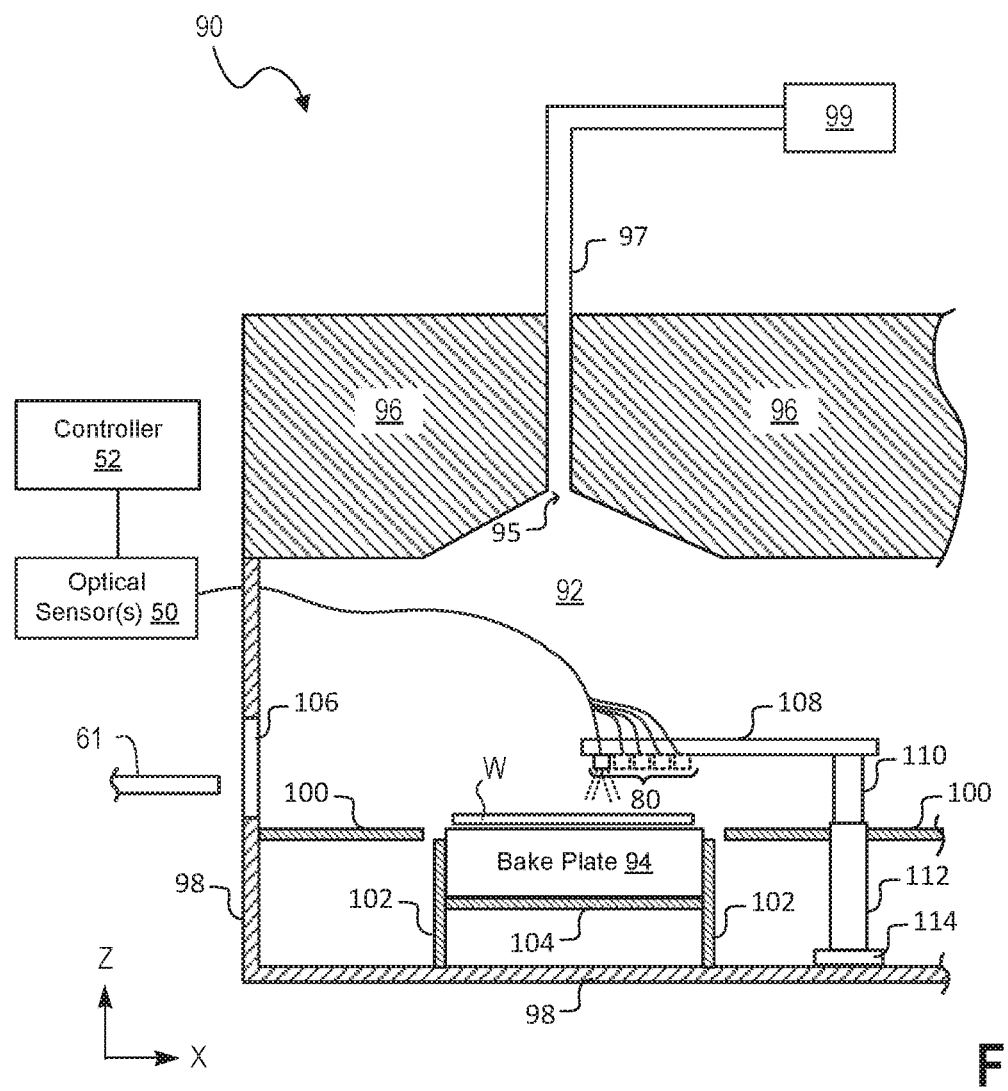
FIG. 9 is a side view illustrating a seventh embodiment of a WIS including one or more optical sensors and a controller, where one or more optical fibers communicatively coupled to the optical sensor(s) are coupled to an arm disposed within a bake module of a substrate processing system.

FIG. 9 is a side view illustrating a seventh embodiment of a substrate inspection system in accordance with the present disclosure. Like the previous embodiments shown in FIG. 4A to FIG. 8, the system shown in FIG. 9 may generally include one or more optical sensors 50 (and/or one or more optical fibers 80), which are coupled to obtain spectral data from a substrate (e.g., wafer W), and a controller 52 coupled to receive the spectral data from the optical sensors 50. The optical sensor(s) 50 shown in FIG. 9 may be implemented with spectrometer(s) or laser-based transceiver(s), as discussed above. In the particular embodiment shown in FIG. 9, one or more optical fibers 80 are coupled to an arm 108 disposed within a bake unit 90 of a substrate processing system. Alternatively, one or more optical sensors (not shown) may be coupled to arm 108 in lieu of the optical fibers 80 shown in FIG. 9.

FIG. 9 illustrates an exemplary bake unit 90, which may be configured to perform a bake process, such as a PAB, PEB, EPEB, or PDB process. In some embodiments, the bake unit 90 shown in FIG. 9 may be a prebaking unit (PREBAKE) 43, a postbaking unit (POBAKE) 44, and/or an adhesion unit (AD) 40 of the substrate processing system 1 shown in FIGS. 1-3. Alternatively, bake unit 90 may be a stand-alone bake module, or may be incorporated within an alternatively configured substrate processing system. It is recognized that bake unit 90 is merely one example of a processing unit within which the monitoring techniques described herein may be applied. Thus, the techniques disclosed herein may be applied to other bake units and/or other processing units.

As shown in FIG. 9, bake unit 90 may generally include a processing chamber 92, a bake plate 94 disposed within the processing chamber 92, and a bake chamber lid 96 forming a portion of the processing chamber 92. One or more heaters (not shown) can be embedded within bake plate 94 to generate heat, which is used to thermally treat (i.e., bake) a substrate mounted onto an upper surface of the bake plate 94. In addition, one or more temperature sensors (not shown) can be embedded within the bake plate 94 to measure the temperature of the bake plate 94.

The bake unit 90 shown in FIG. 9 is bounded by one or more exterior walls 98 and includes at least one horizontal shielding plate 100, one or more interior walls 102 and a supporting plate 104. The at least one horizontal shielding plate 100 and the one or more interior walls 102 can each be coupled to the exterior walls 98 of the bake unit 90. The supporting plate 104 can be coupled between the one or more interior walls 102, thereby forming a mounting region for the bake plate 94. Although not shown in FIG. 9, the bake plate 94 and the supporting plate 104 may each include a plurality of through-holes through which lift pins (not shown in FIG. 9) can be inserted and used to lift a substrate (such as wafer W) off, or lower the substrate onto, the upper surface of the bake plate 94.

When bake unit 90 is configured in a wafer transfer mode, the lift pins may be pushed up to allow a substrate to be transferred into/out of the baking unit 90. As shown in FIG. 9, a processing arm 61 (such as, e.g., the main arm mechanism 22 shown in FIGS. 1 and 3, or the main arm mechanism 55 shown in FIGS. 4A-4C) may transfer a substrate into and out of bake unit 90 via the loading/unloading opening 106 formed in at least one of the exterior walls 98. In some embodiments, processing arm 61 may position a substrate onto the lift pins (not shown), which are lowered to arrange the substrate onto the upper surface of the bake plate 94. In other embodiments, another arm (such as, e.g., arm 108) disposed within bake unit 90 may receive the substrate from processing arm 61 and position the substrate onto the lift pins (not shown) before the lift pins are lowered to arrange the substrate on the bake plate 94. When retrieving a substrate from bake unit 90, the lift pins are raised so that processing arm 61 and/or arm 108 can retrieve the substrate from the bake plate 94 and unload the substrate through loading/unloading opening 106.

When bake unit 90 is configured in an operating mode, the lift pins may be pulled down to arrange the substrate on bake plate 94 and begin thermal treatment (e.g., a bake process) in the processing chamber 92. During a bake process (such as, e.g., a PAB, PEB, EPEB, or PDB process), the temperature of bake plate 94 is raised to thermally treat the substrate. For example, the temperature of bake plate 94 may be increased to a temperature range between about 80° C. and about 250° C. to thermally treat (or bake) one or more layers or films that were previously applied or deposited onto the substrate. Typical layers or films include, but are not limited to, topcoat (TC) barrier layers, topcoat antireflective (TARC) layers, bottom antireflective (BARC) layers, imaging layers (e.g., photoresist) and sacrificial and barrier layers (hard mask) for etch stopping. The bake process time and temperature are used to drive out solvents in the applied film to cure or harden the film. During the bake process, gas generated from the surface of the substrate before, during, and/or after the bake process may be exhausted through an exhaust port 95 formed in the bake chamber lid 96, and vented from the processing chamber 92 via an exhaust line 97 and exhaust unit 99.

In the embodiment shown in FIG. 9, one or more optical fibers 80 are coupled to an arm 108 disposed within bake unit 90. In some embodiments, arm 108 may be a moveable arm, which is configured to transfer substrates between processing arm 61 and bake plate 94. In other embodiments, processing arm 61 may transfer substrates to/from bake plate 94 and arm 108 may be used to position and/or move the one or more optical fibers 80 above a substrate (such as wafer W) when a substrate is arranged on bake plate 94. In other embodiments, arm 108 may be a stationary arm, which is configured to hold the one or more optical fibers 80 above a substrate in a fixed position when a substrate is arranged on bake plate 94.

In the embodiment shown in FIG. 9, arm 108 is mounted at the upper end portion of a vertical support member 110 that is horizontally movable on a guide rail 114 in one direction (e.g., in the Y-direction). Although not shown in FIG. 9, a drive mechanism may be coupled to the arm 108, the vertical support member 110 or the guide rail 114 to move the arm 108 in the Y-direction. Other mechanisms can also be used to move arm 108 in the Z-direction and/or in the X-direction. In some embodiments, for example, the vertical support member 110 may be coupled to a lift mechanism 112 to move the arm 108 up/down in the Z-direction.

In the embodiment shown in FIG. 9, one or more optical fibers 80 are coupled to arm 108 and positioned above bake plate 94, so that light emitted from the optical fiber(s) is directed downwards in a direction (e.g., the Z-direction) normal to the substrate plane. When a substrate (such as wafer W) is positioned on bake plate 94, light emitted from the optical fiber(s) 80 is reflected from the upper surface of the substrate and communicated to optical sensor(s) 50. In some embodiments (not shown), one or more optical sensors may be coupled to arm 108 in lieu of the optical fibers 80 shown in FIG. 9.

In the embodiment shown in FIG. 9, spectral data may be collected from a substrate during processing or immediately after. In some embodiments, spectral data may be collected while processing a substrate by moving arm 108 in one or more directions to scan the light emitted by the optical fiber(s) 80 across the surface of the substrate. In other embodiments, spectral data may be collected immediately after processing a substrate, for example, as a substrate is retrieved from the bake plate 94. In post processing embodiments, spectral data may be collected by moving arm 108 to scan the light emitted by the optical fiber(s) 80 across the surface of the substrate, or by holding the arm 108 stationary while processing arm 61 retrieves the substrate from the bake plate 94. The spectral data may be collected in a variety of different ways (such as, e.g., a line scan, a spiral, a plurality of spokes, a plurality of concentric rings, etc.) depending on the movement of the processing arm 61 and/or movement of the arm 108. The spectral data may be provided to controller 52 for processing.

Figure 10A:
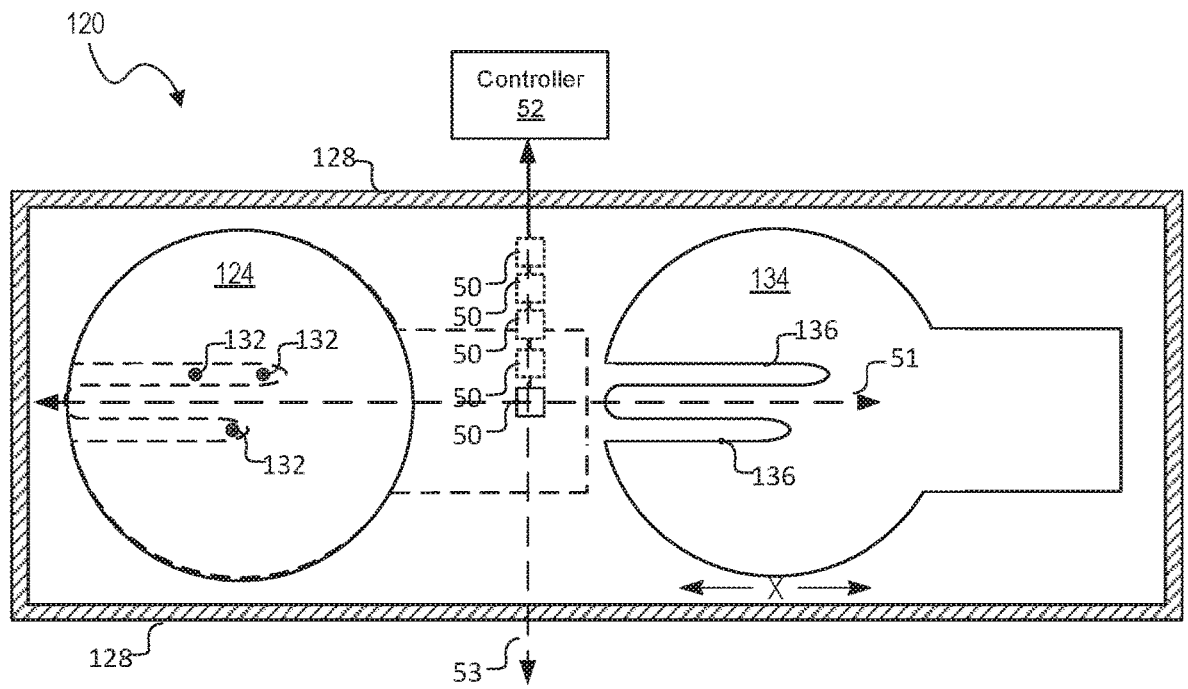
FIG. 10A is a top view illustrating a seventh embodiment of a WIS including one or more optical sensors and a controller, where the optical sensor(s) are coupled to a ceiling of a combined bake module of a substrate processing system.
Figure 10B:
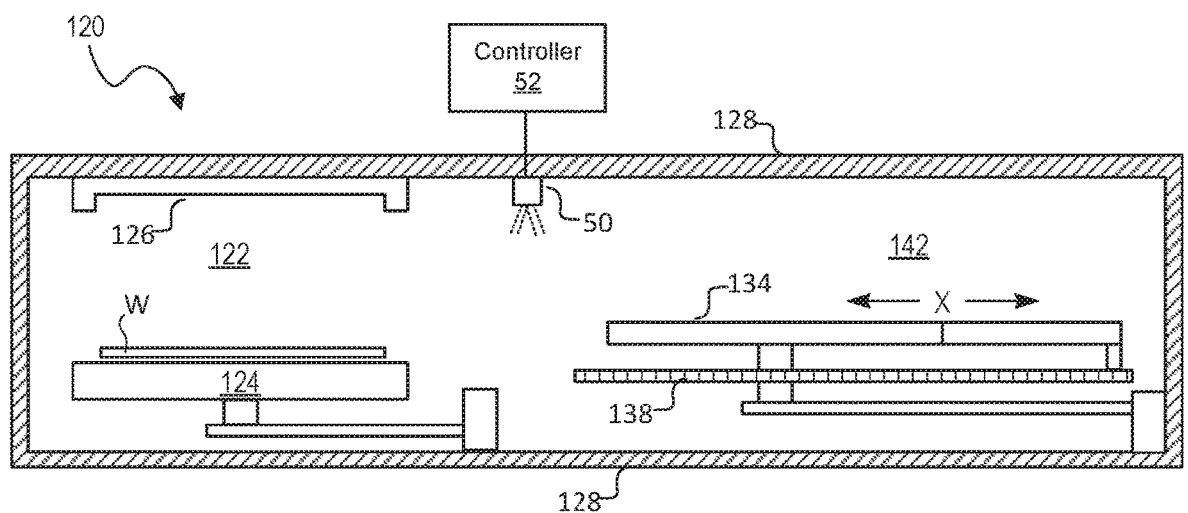
FIG. 10B is a side view of the WIS and combined bake module shown in FIG. 10A.

FIG. 10A is a top view illustrating an eighth embodiment of a substrate inspection system in accordance with the present disclosure. Like the previous embodiments shown in FIG. 4A to FIG. 9, the system shown in FIG. 10A may generally include one or more optical sensors 50 (and/or one or more optical fibers 80), which are coupled to obtain spectral data from a substrate (e.g., wafer W), and a controller 52 coupled to receive the spectral data from the optical sensor(s) 50. In the particular embodiment shown in FIG. 10A, the one or more optical sensors 50 are coupled to a ceiling of a processing unit that provides a bake function and a cooling function (i.e., a combined bake module). FIG. 10B is a side view of the system and the combined bake module shown in FIG. 10A. The optical sensor(s) 50 shown in FIGS. 10A-10B may be implemented with spectrometer(s) or laser-based transceiver(s), as discussed above.

FIGS. 10A-10B illustrate an exemplary combined bake module 120, which may be configured to perform both a bake process (such as a PAB, PEB, EPEB, or PDB process) and a cooling process. In some embodiments, the combined bake module 120 shown in FIGS. 10A-10B may include one or more of the prebaking unit (PREBAKE) 43 and postbaking unit (POBAKE) 44 included within the substrate processing system 1 shown in FIGS. 1-3. Alternatively, combined bake module 120 may be a stand-alone module, or may be incorporated within an alternatively configured substrate processing system. It is recognized that combined bake module 120 is merely one example of a processing unit within which the monitoring techniques described herein may be applied. Thus, the techniques disclosed herein may be applied to other modules that provide baking and/or cooling functions and/or other processing units.

As shown in FIGS. 10A-10B, combined bake module 120 may generally include a processing chamber 122, a bake plate 124 disposed within the processing chamber 122, and a bake chamber lid 126 forming a portion of the processing chamber 122. One or more heaters (not shown) can be embedded within bake plate 124 to generate heat, which is used to thermally treat (or bake) a substrate mounted onto an upper surface of the bake plate 124. In addition, one or more temperature sensors (not shown) can be embedded within bake plate 124 to measure the temperature of the bake plate 124.

As noted above, a number of different bake processes (such as, e.g., a PAB, PEB, EPEB, or PDB process) may be performed within the processing chamber 122 of the combined bake module 120 to thermally treat (or bake) one or more layers or films that were previously applied or deposited onto a substrate (such as wafer W). Typical layers or films include, but are not limited to, topcoat (TC) barrier layers, topcoat antireflective (TARC) layers, bottom antireflective (BARC) layers, imaging layers (e.g., photoresist) and sacrificial and barrier layers (hard mask) for etch stopping. The bake process time and temperature may be selected to drive out solvents in the applied film to cure or harden the film or to induce chemical activity, de-protection reactions and diffusion in the case of PEB.

The combined bake module 120 shown in FIGS. 10A-10B is bounded by one or more exterior walls 128. As shown in FIG. 10B, bake chamber lid 126 is coupled to an inner surface of one exterior wall 128 that forms a ceiling of the combined bake module 120, while bake plate 124 is coupled to an inner surface of another exterior wall 128 that forms a floor of the combined bake module 120. In some embodiments, bake plate 124 may be coupled within a mounting region formed between a supporting plate and one or more interior walls, as shown for example in FIG. 9. In some embodiments, bake plate 124 may include a plurality of through-holes through which lift pins 132 (see, e.g., FIG. 10A) can be inserted and used to lift a substrate (e.g., wafer W) off, or lower the substrate onto, the upper surface of the bake plate 124.

As shown in FIGS. 10A-10B, a cooling arm 134 is disposed within a cooling chamber 142 of the combined bake module 120. The cooling chamber 142 and/or the cooling arm 134 may be configured to perform a cooling process for a substrate that has been thermally treated or baked within processing chamber 122. To perform a cooling process, cooling arm 134 may retrieve a substrate from the upper surface of bake plate 124 and transport the substrate to cooling chamber 142. In some embodiments (see, e.g., FIG. 10A), cooling arm 134 may be linearly translated (e.g., in the X-direction) between a first position (shown in solid lines) in the cooling chamber 142 to a second position (shown in dashed lines) in the processing chamber 122 to retrieve a substrate from bake plate 124. When retrieving the substrate, the plurality of slots 136 formed within cooling arm 134 may accommodate the lift pins 132, which are used to lift the substrate off the upper surface of the bake plate 124.

Cooling may be performed in a variety of different ways. In some embodiment, cooling arm 134 may include cooling mechanisms (not shown) for lowering the temperature of the wafer. In some embodiments, the cooling arm has process cooling water flowing through it to draw away heat. In other embodiments, cooling may be achieved through active temperature controlled (Peltier) cool plates. These cool plates may be provided as independent units.

Cooling arm 134 may be used to transport a substrate to and from bake plate 124. When loading a substrate into the combined bake module 120, for example, cooling arm 134 may receive the substrate from a processing arm (such as, e.g., the main arm mechanism 22 shown in FIGS. 1 and 3, or the main arm mechanism 55 shown in FIGS. 4A-4C) of a substrate processing system, and may position the substrate onto lift pins 132 before the lift pins are lowered to arrange the substrate on the upper surface of the bake plate 124. When performing a cooling process, the lift pins 132 may be raised to allow cooling arm 134 to retrieve a thermally treated substrate from bake plate 124 and transport the substrate to cooling chamber 142. When unloading a substrate from the combined bake module 120, cooling arm 134 may provide a thermally treated substrate and/or a cooled substrate to a processing arm (such as, e.g., the main arm mechanism 22 shown in FIGS. 1 and 3, or the main arm mechanism 55 shown in FIGS. 4A-4C) of a substrate processing system.

In some embodiments, cooling arm 134 may be coupled to a linear guide 138, as shown in FIG. 10B, to enable the cooling arm to move in a linear direction (e.g., the X-direction) for substrate retrieval and transport. In some embodiments (not shown), the linear guide 138 may be coupled to the floor of the combined bake module 120.

In the embodiment shown in FIGS. 10A-10B, one or more optical sensors 50 are coupled to the ceiling of combined bake module 120 and positioned between the processing chamber 122 and the cooling chamber 142, so that light emitted from the optical sensor(s) is directed downwards in a direction (e.g., the Z-direction) normal to the substrate plane. Alternatively, one or more optical fibers (not shown) may be coupled to the ceiling of combined bake module 120 in lieu of the optical sensors 50 shown in FIGS. 10A-10B. When optical fiber(s) are coupled to the ceiling, the optical fiber(s) may be communicatively coupled to a smaller subset of remotely located optical sensor(s) for transmitting light between the optical sensor(s) and substrate surface.

In some embodiments, a single optical sensor 50 (or optical fiber) may be coupled to the ceiling of combined bake module 120 and centered along the substrate retrieval axis 51. In other embodiments, multiple optical sensors 50 (or optical fibers) may be coupled to the ceiling of combined bake module 120. If multiple optical sensors 50 (or optical fibers) are included, the multiple optical sensors 50 may be arranged along the substrate retrieval axis 51 and/or along the axis 53 perpendicular to the substrate retrieval axis 51. Alternatively, the multiple optical sensors 50 (or optical fibers) may be arranged in substantially any configuration, as long as the field of view (FOV) of the optical sensors captures the substrate plane as the substrate is transported between processing chamber 122 and cooling chamber 142, or while the substrate is disposed within the cooling chamber 142.

In the embodiment shown in FIGS. 10A-10B, spectral data may be collected from a substrate while the substrate is being processed or immediately after. When a substrate (such as wafer W) is transported between processing chamber 122 and cooling chamber 142, light emitted from the optical sensor(s) 50 is reflected from the upper surface of the substrate and collected by the optical sensor(s) 50. The spectral data obtained from the reflected light may be collected as a line scan (if a single optical sensor is used) or a grid of spectral data (if multiple optical sensors are used), depending on the number of optical sensors coupled the ceiling of the combined bake module 120. Unlike the previous embodiments shown in FIGS. 6, 7 and 9, coupling the optical sensor(s) 50 to the ceiling of the combined bake module 120 increases the field of view (FOV) of the optical sensor(s). Each of the embodiments shown in FIG. 4A to FIG. 10B includes a controller 52, which receives spectral data from one or more optical sensors 50 of the disclosed wafer inspection system. Controller 52 may be generally configured to analyze the spectral data received from the optical sensor(s) 50 to monitor one or more characteristics of a substrate such as, but not limited to, film thickness (FT) and critical dimension (CD). In some embodiments, for example, controller 52 may use the broadband spectral data obtained from one or more spectrometers (the optical sensor(s) 50), or the more narrowband spectral data collected by laser-based transceiver(s) (the optical sensor(s) 50), to determine a film thickness of a film or layer applied to a surface of a substrate by measuring reflectance of one or more wavelengths. Multi-wavelength approaches may be based on least squares fitting of theoretical to measured reflectance, using assumed values for the refractive indices of the layer(s) observed by the spectrometer(s) (the optical sensor(s) 50).

In other embodiments, controller 52 may compare the broadband spectral data collected by the spectrometer(s) (the optical sensor(s) 50), to a golden spectrum or an average spectrum, so that the comparison results (e.g., differences in spectrum) may be used in wave front detection or coat fault detection. In other embodiments, controller 52 may combine the spectral data collected by the spectrometer(s) or laser-based transceiver(s) (the optical sensor(s) 50), with additional thickness information (e.g., conventionally obtained thickness information) gathered from one or more locations on the substrate to relate spectrum/wavelength(s) to thickness at the one or more locations.

It is noted that the controller(s) described herein can be implemented in a wide variety of manners. In one example, the controller 52 shown in FIG. 4A to FIG. 10B may be a computer. In another example, controller 52 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 52. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 11:
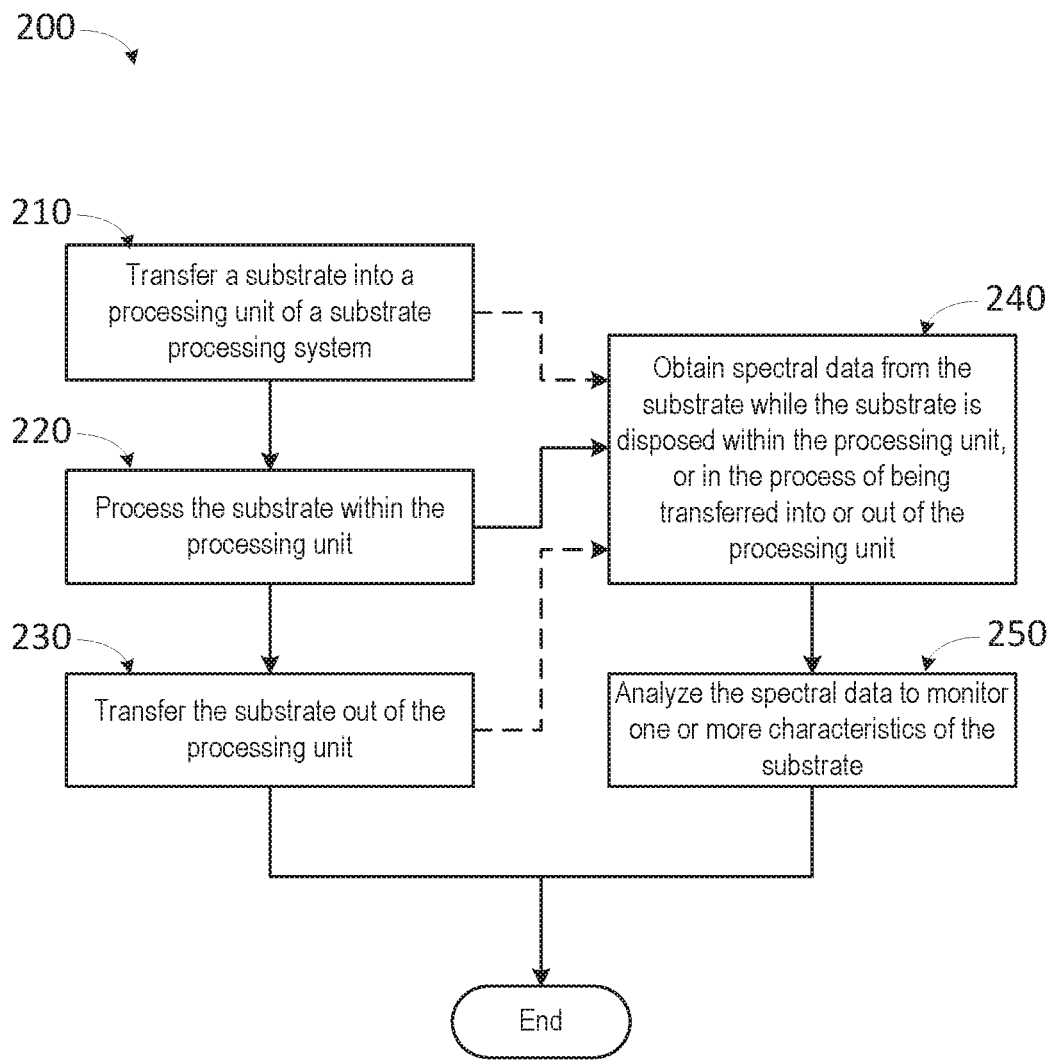
FIG. 11 is a flowchart diagram illustrating one embodiment of a method that may be used to monitor one or more characteristics of a substrate.

FIG. 11 illustrates one embodiment of a method that implements the monitoring techniques described herein. More specifically, FIG. 11 illustrates one embodiment of a method 200 that may be used to monitor one or more characteristics of a substrate. Although not strictly limited to such, the method shown in FIG. 11 may be used within the substrate processing system 1 shown in FIGS. 1-3 and/or within the processing units shown in FIG. 5A to FIG. 10B. More particularly, the substrate processing system may be a liquid dispense substrate processing system and the liquid dispense processing units or the bake processing units of such a system. It will be recognized, however, that the method shown in FIG. 11 is merely exemplary and additional methods may utilize the techniques described herein. Further, additional processing steps may be added to the method shown in the FIG. 11 as the steps described are not intended to be exclusive. Moreover, the order of the steps is not limited to the order shown in FIG. 11 as different orders may occur and/or various steps may be performed in combination or at the same time.

As shown in FIG. 11, method 200 transfers a substrate into a processing unit of a substrate processing system (in step 210), processes the substrate within the processing unit (in step 220), and transfers the substrate out of the processing unit once processing is complete (in step 230). In step 240, method 200 obtains spectral data from the substrate while the substrate is disposed within the processing unit (e.g., while the substrate is being processed in step 220) or in the process of being transferred into or out of the processing unit (in steps 210 or 230). In step 250, method 200 analyzes the spectral data to monitor one or more characteristics of the substrate.

In some embodiments, the spectral data may be obtained (in step 240) as the substrate is transferred into or out of the processing unit. In one example, the spectral data may be obtained from the substrate by one or more reflectometers (for example spectrometers or laser-based transceivers), or inputs to the one or more reflectometers (for example inputs to the spectrometers/transceivers), which are coupled to a main arm mechanism that is arranged between two or more processing units of the substrate processing system for transferring the substrate into and out of the processing units. In another example, the spectral data may be obtained from the substrate by one or more reflectometers (for example spectrometers or laser-based transceivers), or inputs to the one or more reflectometers (for example inputs to the spectrometers/transceivers), which are coupled to the processing unit and positioned above a loading/unloading opening of the processing unit. In another example, the spectral data may be obtained from the substrate by one or more reflectometers (for example spectrometers or laser-based transceivers), or inputs to the one or more reflectometers (for example spectrometers/transceivers), which are coupled to at least one arm disposed within the processing unit.

In other embodiments, the spectral data may be obtained (in step 240) while the substrate is disposed within the processing unit. In one example, the spectral data may be obtained from the substrate by one or more reflectometers (for example spectrometers or laser-based transceivers), or inputs to the one or more reflectometers (for example inputs to the spectrometers/transceivers), which are coupled to a ceiling of the processing unit. In another example, the spectral data may be obtained from the substrate by one or more reflectometers (for example spectrometers or laser-based transceivers), or inputs to the one or more reflectometers (for example inputs to spectrometers/transceivers), which are coupled to at least one arm disposed within the processing unit.

In some embodiments, the spectral data may be obtained (in step 240) at one or more radial positions on the substrate while the substrate is rotated within the processing unit. In some embodiments, the spectral data may be alternatively or additionally be obtained (in step 240) by moving an arm comprising one or more spectrometers or laser-based transceivers, or inputs to the one or more spectrometers/transceivers, above an upper surface of the substrate to collect the spectral data. In some embodiments, the spectral data may be obtained (in step 240) as the substrate is transferred from one processing chamber to another processing chamber within the processing unit.

Figure 12:
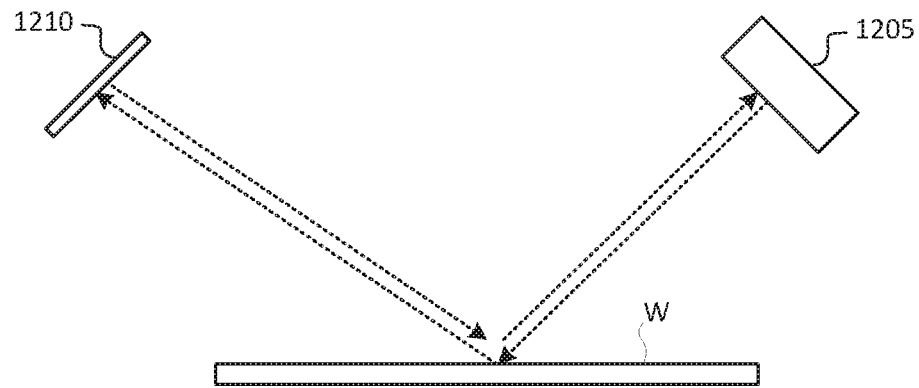
FIG. 12 is a side view illustrating one embodiment of the use of integral unit transceiver along with an optical element in the light path.
Figure 13:
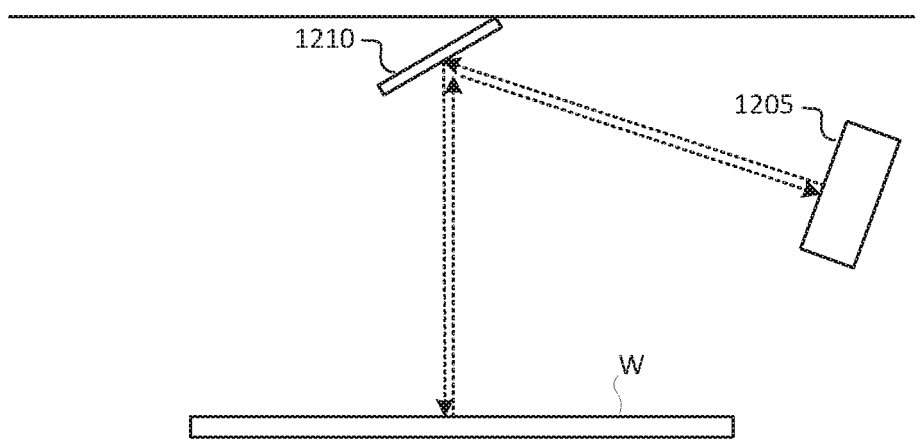
FIG. 13 is a side view illustrating another embodiment of the use of integral unit transceiver along with an optical element in the light path.

As discussed above, a wide range of light sources and optical sensor hardware may be utilized to perform the techniques described herein. In one example (such as the laser based transceiver described above by Keyence), the light source and the optical sensor may be provided together in one integral unit. In some embodiments, the integral unit may be provided to provide light to the substrate that is normal or near normal and received back from the substrate without the use of intervening optical elements. Alternatively, a non-normal angle of incidence may be utilized in conjunction with additional optical elements. For example, as shown in FIG. 12, a light source and optical sensor is provided as an integral unit as transceiver 1205. As shown in FIG. 12, light from the transceiver 1205 is directed at the substrate (wafer W) at a non-normal angle of incidence, then to the optical element 1210, then back again to the substrate and then received by the transceiver 1205. In one embodiment the optical element 1210 may be a mirror. In yet another embodiment, the additional optical elements may be used when providing normal incident light. Thus as shown in FIG. 13, For example, as shown in FIG. 13, a light source and optical sensor is provided as an integral unit as transceiver 1205. As shown in FIG. 13, light from the transceiver 1205 is first directed at the optical element 1210 which in turn redirects the light to the substrate (wafer W) at a normal angle of incidence, then light returns from the substrate to the optical element 1210 and then the light is received by the transceiver 1205. In one embodiment the optical element 1210 may be a mirror.

It will be recognized that though the at least some examples described above for normal and other angles of incidence have been described above with regard to a light source and optical sensor (such as transceiver 1205) that is formed as an integral unit, the light source and the optical sensor may be alternatively formed as separate hardware which may be located in close proximity or alternatively spaced significantly apart.

It will be recognized that the method embodiments disclosed herein may be utilized before, during or after a wide range of substrates have been processed in a processing unit, such as a liquid dispense unit, a baking unit or a combined bake module. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps that yield a wide variety of structures and layers, all of which are known in the substrate processing art, and which may be considered to be part of the substrate. For example, in one embodiment, the substrate may be a semiconductor wafer having one or more semiconductor processing layers formed thereon. Although the concepts disclosed herein may be utilized at any stage of the substrate process flow, the monitoring techniques described herein may generally be performed before, during or after a substrate is subject to a coat process, a bake process, a cooling process or a develop process.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A system for dispensing a liquid on a substrate, the system comprising:
a plurality of processing units, wherein the plurality of processing units comprise at least one liquid dispense unit and at least one bake unit, the liquid dispense unit configured to dispense the liquid on the substrate;
a substrate inspection system configured to monitor one or more characteristics of the substrate while the substrate is disposed within the at least one liquid dispense unit or the at least one bake unit or in a process of being transferred into or out of the at least one liquid dispense unit or the at least one bake unit, wherein the substrate inspection system comprises:
one or more reflectometers configured to obtain spectral data from the substrate; and
a controller coupled to receive the spectral data from the one or more reflectometers and configured to analyze the spectral data to detect one or more characteristics of the substrate.

2. The system of claim 1, wherein the one or more reflectometers comprise one or more spectrometers or comprise one or more laser-based transceivers.

3. The system of claim 2, wherein the one or more reflectometers, or one or more inputs to the one or more reflectometers, are coupled to the at least one liquid dispense unit or the at least one bake unit and positioned above a loading/unloading opening of the at least one liquid dispense unit or the at least one bake unit.

4. The system of claim 1, wherein the one or more reflectometers are configured to obtain the spectral data from the substrate as the substrate is being transferred into or out of the at least one liquid dispense unit or the at least one bake unit.

5. The system of claim 1, wherein the one or more reflectometers, or one or more inputs to the one or more reflectometers, are disposed within the at least one liquid dispense unit or the at least one bake unit, and wherein the one or more reflectometers are configured to obtain the spectral data from the substrate as the substrate is being processed within the at least one liquid dispense unit or the at least one bake unit or immediately after the processing is complete.

6. The system of claim 5, wherein the one or more reflectometers, or one or more inputs to the one or more reflectometers, are coupled to (1) at least one moveable arm disposed within the at least one liquid dispense unit or the at least one bake unit, or (2) a ceiling of the at least one liquid dispense unit or the at least one bake unit.

7. The system of claim 1, wherein the substrate inspection system is configured to monitor one or more characteristics of the substrate while the substrate is disposed within the at least one liquid dispense unit or in a process of being transferred into or out of the at least one liquid dispense unit, wherein the at least one liquid dispense unit comprises a spin chuck to support and rotate the substrate.

8. The system of claim 1, wherein the substrate inspection system is configured to monitor one or more characteristics of the substrate while the substrate is disposed within the at least one bake unit or in a process of being transferred into or out of the at least one bake unit, wherein the at least one bake unit comprises a bake plate to thermally treat the substrate.

9. The system of claim 8, wherein the at least one bake unit is a post apply bake unit.

10. The system of claim 1, wherein the controller uses the spectral data received from the one or more reflectometers to determine a film thickness of a film or layer applied to a surface of the substrate by measuring reflectance of a spectrum of wavelengths.

11. The system of claim 1, wherein the controller compares the spectral data received from the one or more reflectometers to a golden spectrum or an average spectrum to detect differences in spectrum that are used in wave front detection or coat fault detection.

12. The system of claim 1, wherein the controller combines the spectral data received from the one or more reflectometers with additional thickness information obtained from one or more locations on the substrate to relate spectrum to thickness at the one or more locations.

13. The system of claim 1, wherein the one or more reflectometers is provided as a single integral unit which provides a light source and an optical sensor.

14. The system of claim 1, further comprising an optical element which redirects light provided to and/or from the substrate such that light received by the one or more reflectometers is provided at a non-normal angle of incident with respect to the substrate.

15. The system of claim 1, further comprising an optical element which redirects light provided to and/or from the substrate such that light received by the one or more reflectometers is provided at normal angle of incident with respect to the substrate.

16. A method to monitor one or more characteristics of a substrate in a liquid dispense substrate processing system which is configured to dispense a liquid on the substrate, the method comprising:

transferring the substrate into a processing unit of the liquid dispense substrate processing system, the processing unit being a liquid dispense unit or a bake unit;

processing the substrate within the processing unit;

transferring the substrate out of the processing unit once processing is complete;

obtaining spectral data from the substrate while the substrate is disposed within the processing unit or in a process of being transferred into or out of the processing unit, wherein the spectral data is obtained utilizing a reflectometer; and analyzing the spectral data to monitor one or more characteristics of the substrate.

17. The method of claim 16, wherein the obtaining the spectral data comprises obtaining the spectral data as the substrate is transferred into or out of the processing unit, wherein the spectral data is obtained from the substrate by one or more optical sensors of a reflectometer.

18. The method of claim 17, further wherein a single integral unit having a light source and an optical sensor is utilized when obtaining the spectral data from the substrate.

19. The method of claim 16, wherein the obtaining the spectral data comprises obtaining the spectral data while the substrate is disposed within the processing unit, wherein the spectral data is obtained from the substrate by one or more optical sensors of a reflectometer.

20. The method of claim 16, wherein the reflectometer comprises a spectrometer or a laser-based transceiver.

21. The method of claim 16, wherein the obtaining the spectral data comprises obtaining the spectral data at one or more radial positions on the substrate while the substrate is rotated within the processing unit.

22. The method of claim 21, wherein the obtaining the spectral data comprises obtaining the spectral data from the substrate by moving an arm comprising the one or more optical sensors of the reflectometer, or one or more inputs to the one or more optical sensors of the reflectometer, above an upper surface of the substrate to collect the spectral data.

23. The method of claim 16, wherein the processing unit is a liquid dispense unit that comprises a spin chuck to support and rotate the substrate.

24. The method of claim 16, wherein the processing unit is a bake unit.

25. The method of claim 24, wherein the bake unit is a post apply bake unit.

* * * * *